(12) United States Patent
Hsiao et al.

(10) Patent No.: US 10,884,665 B2
(45) Date of Patent: Jan. 5, 2021

(54) DATA READING METHOD, STORAGE CONTROLLER AND STORAGE DEVICE FOR OPTIMIZING READ VOLTAGES

(71) Applicant: Shenzhen EpoStar Electronics Limited CO., Shenzhen (CN)

(72) Inventors: Yu-Hua Hsiao, Hsinchu County (TW); Chia-Wei Chang, Kaohsiung (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 10 days.

(21) Appl. No.: 16/355,875

(22) Filed: Mar. 18, 2019

(65) Prior Publication Data

US 2020/0201569 A1 Jun. 25, 2020

(30) Foreign Application Priority Data

Dec. 22, 2018 (TW) .............................. 107146597 A

(51) Int. Cl.
| | |
|---|---|
| *G06F 3/06* | (2006.01) |
| *G11C 16/26* | (2006.01) |
| *G11C 29/52* | (2006.01) |
| *G06F 11/10* | (2006.01) |
| *H03K 23/00* | (2006.01) |

(Continued)

(52) U.S. Cl.
CPC .......... *G06F 3/0659* (2013.01); *G06F 3/0604* (2013.01); *G06F 3/0679* (2013.01); *G06F 11/1068* (2013.01); *G11C 16/26* (2013.01); *G11C 29/52* (2013.01); *G11C 11/5642* (2013.01); *G11C 11/5671* (2013.01); *G11C 16/0483* (2013.01); *H03K 23/005* (2013.01)

(58) Field of Classification Search
CPC ... G11C 16/26; G11C 11/5642; G11C 29/028; G11C 16/10; G11C 29/021; G11C 16/0483; G11C 11/5671; G11C 16/3495; G11C 29/42; G11C 29/52; G11C 16/08; G06F 3/0679; G06F 3/0604; G06F 3/0659; G06F 13/1668; G06F 13/4282; G06F 2213/0012; G06F 2213/0026; G06F 2213/0032; G06F 2213/0042; G06F 3/0632; G06F 11/1068
USPC ......................................................... 711/103
See application file for complete search history.

(56) References Cited

U.S. PATENT DOCUMENTS

| | | | |
|---|---|---|---|
| 2017/0148510 A1* | 5/2017 | Bazarsky | G11C 16/26 |
| 2017/0271031 A1* | 9/2017 | Sharon | G06F 11/3058 |
| 2019/0304546 A1* | 10/2019 | Hsiao | G06F 13/4282 |

\* cited by examiner

*Primary Examiner* — Hashem Farrokh
(74) *Attorney, Agent, or Firm* — JCIPRNET

(57) ABSTRACT

A data reading method is provided. The method includes using X read voltage sets to read a target word line, so as to obtain X read results; in a first order, updating a final Gray code index of each of a plurality of target memory cells of the target word line, and obtaining (X−1) abnormal Gray code count sets according to the X read results, wherein an $i^{th}$ read result among the X read results includes a Gray code corresponding to an $i^{th}$ read voltage set of each of the target memory cells, and the Gray code corresponds to one of N Gray code indexes; and selecting (N−1) optimized read voltages from (X−1)*(N−1) read voltages of the corresponding (X−1) read voltage sets to form an optimized read voltage set according to the obtained (X−1) abnormal Gray code count sets.

15 Claims, 14 Drawing Sheets

(51) Int. Cl.
*G11C 16/04* (2006.01)
*G11C 11/56* (2006.01)

| Comparison | | Whether to update the final Gray code index? | Whether to accumulate the abnormal Gray code count value of the corresponding read voltage? |
|---|---|---|---|
| Test Gray code index | < Final Gray code index | Yes | No |
| Test Gray code index | = Final Gray code index | No | No |
| Test Gray code index | > Final Gray code index | No | Yes |

| Read voltage set V(i) | Abnormal Gray code count value sum | $V(i)_1$ Abnormal Gray code count value | $V(i)_2$ Abnormal Gray code count value | $V(i)_3$ Abnormal Gray code count value | $V(i)_4$ Abnormal Gray code count value | $V(i)_5$ Abnormal Gray code count value | $V(i)_6$ Abnormal Gray code count value | $V(i)_7$ Abnormal Gray code count value | |
|---|---|---|---|---|---|---|---|---|---|
| V(1) | | | | | | | | | ⎫ AC(1) |
| V(2) | 57 | 0 | 18 | 1 | 16 | 4 | 8 | 10 | |
| V(3) | <u>48</u> | 2 | 15 | 6 | 10 | 8 | 15 | 6 | |
| V(4) | <u>28</u> | 1 | 3 | 3 | 10 | 6 | 3 | 2 | |
| V(5) | <u>16</u> | 0 | 5 | 3 | 4 | 1 | 2 | 1 | |
| V(6) | <u>6</u> | <u>0</u> | 2 | 1 | 3 | 0 | <u>0</u> | 0 | ... |
| V(7) | <u>7</u> | 0 | <u>1</u> | <u>0</u> | 4 | <u>0</u> | 2 | 0 | |
| V(8) | <u>8</u> | 0 | 3 | 1 | 3 | 0 | 1 | <u>0</u> | |
| V(9) | <u>9</u> | 0 | 2 | 1 | 2 | 0 | 4 | 0 | |
| V(10) | <u>12</u> | 0 | 2 | 2 | <u>1</u> | 2 | 5 | 0 | |
| V(11) | <u>21</u> | 1 | 3 | 6 | 2 | 4 | 3 | 2 | |
| V(12) | <u>26</u> | 2 | 2 | 6 | 3 | 2 | 8 | 3 | |
| V(13) | <u>44</u> | 2 | 6 | 12 | 8 | 6 | 10 | 0 | |
| V(14) | 93 | 6 | 11 | 13 | 8 | 24 | 25 | 6 | |
| V(15) | 126 | 3 | 20 | 16 | 20 | 29 | 27 | 11 | |
| V(16) | 217 | 7 | 35 | 24 | 34 | 44 | 46 | 27 | |
| V(17) | 297 | 14 | 39 | 47 | 47 | 40 | 71 | 39 | ⎫ AC(16) |

Abnormal Gray code count value sum threshold: 50

T910 / ADA(1) ... ADA(17)

| Read voltage set V(i) | Normal Gray code absolute deviation-from-average sum | Absolute deviation-from-average of G1 | Absolute deviation-from-average of G2 | Absolute deviation-from-average of G3 | Absolute deviation-from-average of G4 | Absolute deviation-from-average of G5 | Absolute deviation-from-average of G6 | Absolute deviation-from-average of G7 | Absolute deviation-from-average of G8 |
|---|---|---|---|---|---|---|---|---|---|
| V(1) | 2726 | 370 | 333 | 345 | 313 | 324 | 399 | 327 | 315 |
| V(2) | 2544 | 301 | 318 | 333 | 317 | 325 | 309 | 304 | 337 |
| V(3) | 1905 | 250 | 231 | 316 | 254 | 201 | 219 | 227 | 207 |
| V(4) | 1359 | 165 | 153 | 175 | 181 | 137 | 159 | 134 | 170 |
| V(5) | 1274 | 123 | 107 | 126 | 107 | 100 | 99 | 124 | 111 |
| V(6) | 803 | 103 | 97 | 95 | 114 | 117 | 89 | 91 | 97 |
| V(7) | 557 | 76 | 72 | 70 | 75 | 71 | 64 | 63 | 66 |
| V(8) | 508 | 75 | 69 | 55 | 61 | 59 | 49 | 69 | 71 |
| V(9) | 310 | 41 | 45 | 36 | 27 | 54 | 36 | 27 | 44 |
| V(10) | 516 | 76 | 70 | 56 | 62 | 60 | 50 | 70 | 72 |
| V(11) | 565 | 77 | 73 | 71 | 76 | 72 | 65 | 64 | 67 |
| V(12) | 811 | 104 | 98 | 96 | 115 | 118 | 90 | 92 | 98 |
| V(13) | 1282 | 124 | 108 | 127 | 108 | 101 | 100 | 125 | 112 |
| V(14) | 1367 | 166 | 154 | 176 | 182 | 138 | 160 | 135 | 171 |
| V(15) | 1913 | 251 | 232 | 317 | 255 | 202 | 220 | 228 | 208 |
| V(16) | 2552 | 302 | 319 | 334 | 318 | 326 | 310 | 305 | 338 |
| V(17) | 2734 | 371 | 334 | 346 | 314 | 325 | 400 | 328 | 316 |

Absolute deviation-from-average sum threshold: 600

T920

| Read voltage set V(i) | Abnormal Gray code absolute deviation-from-average sum | Normal Gray code absolute deviation-from-average sum | Abnormal Gray code count value sum | V(i)1 Abnormal Gray code count value | V(i)2 Abnormal Gray code count value | V(i)3 Abnormal Gray code count value | V(i)4 Abnormal Gray code count value | V(i)5 Abnormal Gray code count value | V(i)6 Abnormal Gray code count value | V(i)7 Abnormal Gray code count value |
|---|---|---|---|---|---|---|---|---|---|---|
| V(1) | | | | | | | | | | |
| V(2) | 39.1 | 2544 | 57 | 0 | 18 | 1 | 16 | 4 | 8 | 10 |
| V(3) | 26.9 | 1905 | 48 | 2 | 15 | 6 | 10 | 8 | 15 | 6 |
| V(4) | 16.0 | 1359 | 28 | 1 | 3 | 3 | 10 | 6 | 3 | 2 |
| V(5) | 10.3 | 1274 | 16 | 0 | 5 | 3 | 4 | 1 | 2 | 1 |
| V(6) | 6.9 | 803 | 6 | 0 | 2 | 1 | 3 | 0 | 0 | 0 |
| V(7) | 8.0 | 557 | 7 | 0 | 1 | 0 | 4 | 0 | 2 | 0 |
| V(8) | 7.4 | 508 | 8 | 0 | 3 | 1 | 3 | 0 | 1 | 0 |
| V(9) | 8.3 | 310 | 9 | 0 | 2 | 1 | 2 | 0 | 4 | 0 |
| V(10) | 8.3 | 516 | 12 | 0 | 2 | 2 | 1 | 2 | 5 | 0 |
| V(11) | 8.0 | 565 | 21 | 1 | 3 | 6 | 2 | 4 | 3 | 2 |
| V(12) | 13.1 | 811 | 26 | 2 | 2 | 6 | 3 | 2 | 8 | 3 |
| V(13) | 22.3 | 1282 | 44 | 2 | 6 | 12 | 8 | 6 | 10 | 0 |
| V(14) | 44.9 | 1367 | 93 | 6 | 11 | 13 | 8 | 24 | 25 | 6 |
| V(15) | 48.0 | 1913 | 126 | 3 | 20 | 16 | 20 | 29 | 27 | 11 |
| V(16) | 70.0 | 2552 | 217 | 7 | 35 | 24 | 34 | 44 | 46 | 27 |
| V(17) | 75.4 | 2734 | 297 | 14 | 39 | 47 | 47 | 40 | 71 | 39 |

AC(1) ... ADA(16)

Normal Gray code absolute deviation-from-average sum threshold:600
Abnormal Gray code absolute deviation-from-average sum threshold:20

FIG. 9D

DATA READING METHOD, STORAGE CONTROLLER AND STORAGE DEVICE FOR OPTIMIZING READ VOLTAGES

CROSS-REFERENCE TO RELATED APPLICATION

This application claims the priority benefit of Taiwan application serial no. 107146597, filed on Dec. 22, 2018. The entirety of the above-mentioned patent application is hereby incorporated by reference herein and made a part of this specification.

BACKGROUND

Field of the Disclosure

The disclosure relates to a data reading method and more particularly, to a data reading method, a storage controller and a storage device adapted for a storage device configured with a rewritable non-volatile memory module.

Description of Related Art

Digital cameras, mobile phones and MP3 players have grown very rapidly in recent years, and accordingly, consumers' demands for storage media has increased rapidly. A rewritable non-volatile memory module (e.g., a flash memory) is suitable for being built in the aforementioned portable multi-media devices listed above due to having characteristics such as data non-volatility, low power consumption, compact size and no mechanical structure.

Along with the advancement of technologies, in order to satisfy growing storage demands, memory architectures of the rewritable non-volatile memory module is also developed to have a greater unit storage space, for example, a triple level cell (TLC) NAND flash memory module (i.e., a flash memory module capable of storing data of 3 bits in one memory cell), a quadruple level cell (QLC) NAND flash memory module (i.e., a flash memory module capable of storing data of 4 bits in one memory cell), a triple-level cell (TLC) NAND flash memory module (i.e., a flash memory module capable of storing data of 4 bits in one memory cell) or a rewritable non-volatile memory module having a three-dimensional (3D) stacking structure (e.g., a 3D NAND flash memory module or a vertical NAND flash memory module). However, because memory cells of the aforementioned flash memory modules have less stable physical states, which results in less stable threshold voltages of the memory cells of the aforementioned flash memory modules, threshold voltage distributions of the memory cells of the aforementioned flash memory modules cannot be accurately measured.

Thus, how to overcome the issue of unstable threshold voltages of the memory cells to obtain more accurate threshold voltage distributions and perform optimization on read voltages according to the more accurate threshold voltage distributions to improve a reading efficiency of the rewritable non-volatile memory module and its corresponding decoding efficiency is one of the subjects studied by people in the field.

SUMMARY

The disclosure provides a data reading method, a storage controller and a storage device capable of determining an abnormal threshold voltage distribution to find out an optimized read voltage.

An embodiment of the disclosure provides a data reading method for a storage device configured with a rewritable non-volatile memory module, wherein the rewritable non-volatile memory module has a plurality of word lines and a plurality of memory cells, and the memory cells are grouped into the word lines. The method includes: using X read voltage sets to read a target word line among the word lines, so as to obtain X read results, wherein a plurality of target memory cells among the memory cells corresponding to the target memory cells of the target word line are all programmed, wherein the X read voltage sets are sorted in a first order according to an average voltage value of each of the X read voltage sets, wherein a difference value of an average voltage value of an $(i+1)^{th}$ read voltage set among the X read voltage sets deducted by an average voltage value of an $i^{th}$ read voltage set is a positive predetermined voltage offset value, wherein each of the X read voltage sets has (N−1) read voltages sorted in a second order, wherein X is a first predetermined positive integer, i is a positive integer ranging from 1 to X, i is initially set to 1, and N is a second predetermined positive integer greater than 2; in the first order, updating a final Gray code index of each of the target memory cells and obtaining (X−1) abnormal Gray code count sets according to the X read results, wherein an $i^{th}$ read result among the X read results includes a Gray code corresponding to the $i^{th}$ read voltage set of each of the target memory cells, and the Gray code corresponds to one of N Gray code indexes; and selecting (N−1) optimized read voltages from (X−1)*(N−1) read voltages of the corresponding (X−1) read voltage sets according to the obtained (X−1) abnormal Gray code count sets to form an optimized read voltage set.

An embodiment of the disclosure provides a storage controller of a storage device configured with a rewritable non-volatile memory module. The storage controller includes a memory interface control circuit, a read voltage management unit and a processor. The memory interface control circuit is configured to couple to the rewritable non-volatile memory module, wherein the rewritable non-volatile memory module includes a plurality of word lines, and the memory cells are grouped into the word lines. The processor is coupled to the memory interface control circuit and the read voltage management unit. The processor selects a target word line from the word lines and instructs the read voltage management unit to perform a read voltage optimization operation corresponding to the target word line. In the read voltage optimization operation, the read voltage management unit is configured to use X read voltage sets to read the target word line among the word lines, so as to obtain X read results, wherein a plurality of target memory cells among the memory cells correspond to the target word line, and all of the target memory cells are programmed, wherein the X read voltage sets are sorted in a first order according to an average voltage value of each of the X read voltage sets, wherein a difference value of an average voltage value of an $(i+1)^{th}$ read voltage set among the X read voltage sets deducted by an average voltage value of an $i^{th}$ read voltage set is a positive predetermined voltage offset value, wherein each of the X read voltage sets has (N−1) read voltages sorted in a second order, wherein X is a first predetermined positive integer, i is a positive integer ranging from 1 to X, i is initially set to 1, and N is a second predetermined positive integer greater than 2. In addition, the read voltage management unit is further configured to in the first order, update a final Gray code index of each of the target memory cells and obtain (X−1) abnormal Gray code count sets according to the X read results, wherein an $i^{th}$ read result among the X read results includes a Gray code corresponding to the $i^{th}$ read voltage set of each of the target memory cells, and the Gray code corresponds to one of N Gray code indexes. Finally, the read voltage management unit is further configured to select (N−1) optimized read voltages from (X−1)*(N−1) read voltages of the corresponding (X−1) read voltage sets according to the obtained (X−1) abnormal Gray code count sets to form an optimized read voltage set.

An embodiment of the disclosure provides a storage device. The storage device includes a rewritable non-volatile memory module, a memory interface control circuit and a processor. The rewritable non-volatile memory module includes a plurality of word lines, and each of the word lines is coupled to a plurality of memory cells. The memory interface control circuit is configured to couple to the rewritable non-volatile memory module. The processor is coupled to the memory interface control circuit. The processor loads and executes a read voltage management program code module to perform a read voltage optimization operation. The read voltage optimization operation includes the following steps: using X read voltage sets to read a target word line among the word lines, so as to obtain X read results, wherein a plurality of target memory cells among the memory cells correspond to the target word line, and all of the target memory cells are programmed, wherein the X read voltage sets are sorted in a first order according to an average voltage value of each of the X read voltage sets, wherein a difference value of an average voltage value of an $(i+1)^{th}$ read voltage set among the X read voltage sets deducted by an average voltage value of an $i^{th}$ read voltage set is a positive predetermined voltage offset value, wherein each of the X read voltage sets has (N−1) read voltages sorted in a second order, wherein X is a first predetermined positive integer, i is a positive integer ranging from 1 to X, i is initially set to 1, and N is a second predetermined positive integer greater than 2; in the first order, updating a final Gray code index of each of the target memory cells and obtaining (X−1) abnormal Gray code count sets according to the X read results, wherein an $i^{th}$ read result among the X read results includes a Gray code corresponding to the $i^{th}$ read voltage set of each of the target memory cells, and the Gray code corresponds to one of N Gray code indexes; and selecting (N−1) optimized read voltages from (X−1)*(N−1) read voltages of the corresponding (X−1) read voltage sets according to the obtained (X−1) abnormal Gray code count sets to form an optimized read voltage set.

To sum up, the data reading method, the storage controller and the storage device provided by the embodiments of the disclosure can update the final Gray code indexes corresponding to all of the target memory cells of the target word line according to the read results obtained by reading the target word line read through the read voltage sets and obtain the corresponding abnormal Gray code count sets, so as to obtain the optimized read voltage set from the read voltage sets according to the abnormal Gray code count sets.

To make the above features and advantages of the disclosure more comprehensible, embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 6A and FIG. 6B are schematic diagrams illustrating the determination of the final Gray code index and the abnormal Gray code count value according to an embodiment of the disclosure.

FIG. 8 is a schematic diagram illustrating the determination of the optimized read voltage set according to an embodiment of the disclosure.

FIG. 9C is a schematic diagram illustrating the determination of the optimized read voltage set according to an embodiment of the disclosure.

FIG. 9D is a schematic diagram illustrating the search range for determining the optimized read voltage set according to an embodiment of the disclosure.

DESCRIPTION OF EMBODIMENTS

Figure 1:
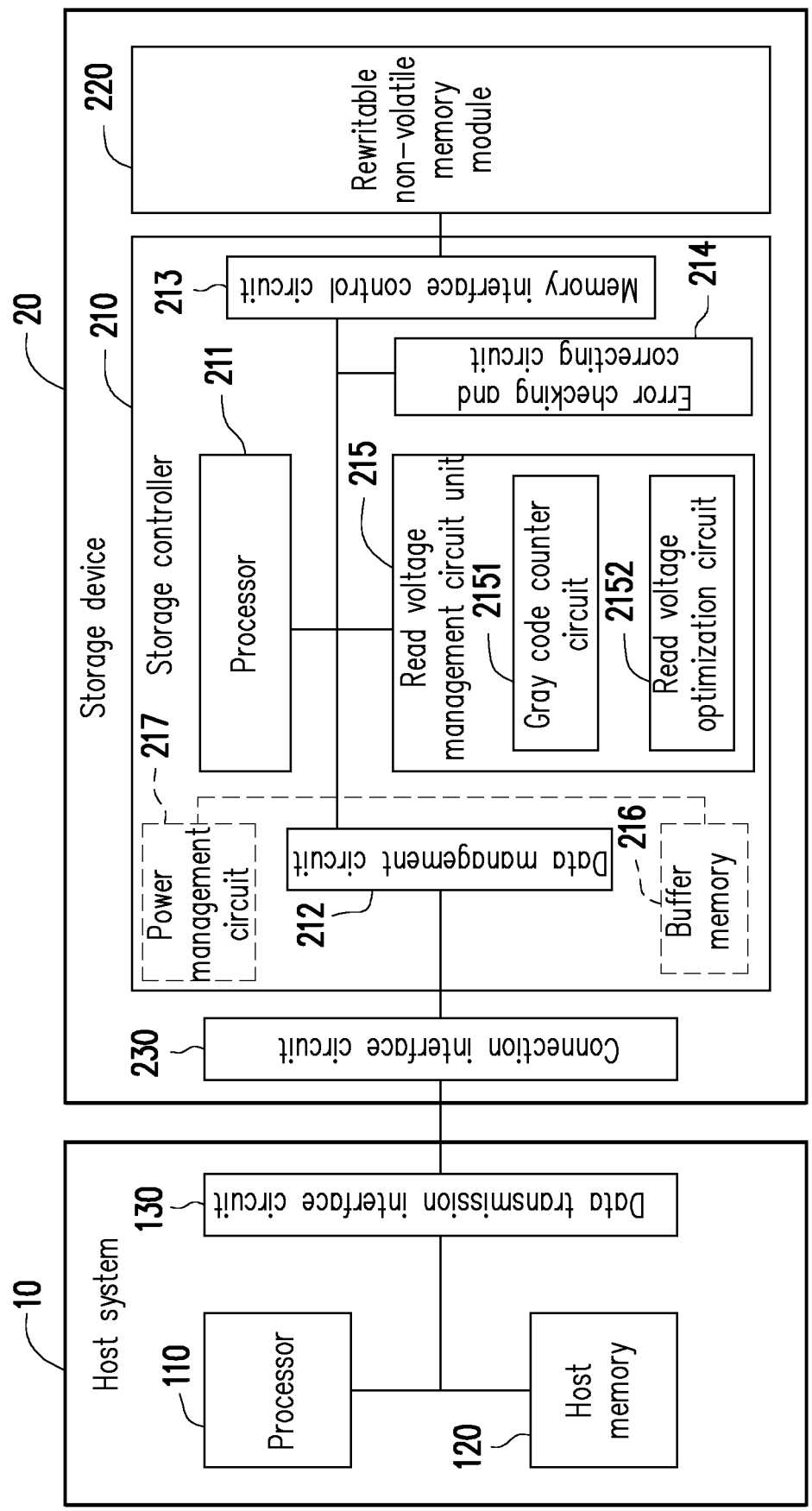
FIG. 1 is a schematic block diagram illustrating a host system and a storage device according to an embodiment of the disclosure.

Reference will now be made in detail to the preferred embodiments of the disclosure, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In this embodiment, a storage device includes a rewritable non-volatile memory module and a storage device controller (a.k.a. a storage controller or a storage control circuit). Also, the storage device is usually used together with a host system 10 so the host system 10 can write data into or read data from the storage device 20.

FIG. 1 is a schematic block diagram illustrating a host system and a storage device according to an embodiment of the disclosure.

With reference to FIG. 1, the host system 10 includes a processor 110, a host memory 120 and a data transfer interface circuit 130. In this embodiment, the data transfer interface circuit 130 is coupled to (or, electrically connected to) the processor 110 and the host memory 120. In another embodiment, the processor 110, the host memory 120 and the data transfer interface circuit 130 are coupled to one another by utilizing a system bus.

The storage device 20 includes a storage controller 210, a rewritable non-volatile memory module 220 and a connection interface circuit 230. Among them, the storage controller 210 includes a processor 211, a data management circuit 212 and a memory interface control circuit 213.

In this embodiment, the host system 10 is coupled to the storage device 20 through the data transfer interface circuit 130 and the connection interface circuit 230 of the storage device 20 to perform a data accessing operation. For example, the host system 10 can store data to the storage device 20 or read data from the storage device 20 through the data transfer interface circuit 130.

In this embodiment, the processor 110, the host memory 120 and the data transfer interface circuit 130 may be disposed on a main board of the host system 10. The number of the data transfer interface circuit 130 may be one or more. Through the data transfer interface circuit 130, the main board may be coupled to the storage device 20 in a wired manner or a wireless manner. The storage device 20 may be, for example, a flash drive, a memory card, a solid state drive (SSD) or a wireless memory storage device. The wireless memory storage device may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board may also be coupled to various I/O devices, including a global positioning system (GPS) module, a network interface card, a wireless transmission device, a keyboard, a monitor and a speaker, through the system bus.

In this embodiment, the data transfer interface circuit 130 and the connection interface circuit 230 are interface circuits compatible with a peripheral component interconnect express (PCI Express) interface standard. Further, a data transfer operation is performed between the data transfer interface circuit 130 and the connection interface circuit 230 by using a communication protocol of a non-volatile memory express (NVMe) interface standard.

Nevertheless, it should be understood that the disclosure is not limited to the above. The data transfer interface circuit 130 and the connection interface circuit 230 may also be compatible with a parallel advanced technology attachment (PATA) standard, an institute of electrical and electronic engineers (IEEE) 1394 standard, a universal serial bus (USB) standard, a SD interface standard, a ultra high speed-I (UHS-I) interface standard, a ultra high speed-II (UHS-II) interface standard, a memory stick (MS) interface standard, a multi-chip package interface standard, a multi media card (MMC) interface standard, an eMMC interface standard, a universal flash storage (UFS) interface standard, an eMCP interface standard, a CF interface standard, an integrated device electronics (IDE) interface standard or other suitable standards. Further, in another embodiment, the connection interface circuit 230 and the storage controller 210 may be packaged into one chip, or the connection interface circuit 230 is distributed outside a chip containing the storage controller 210.

In this embodiment, the host memory 120 is configured to temporarily store commands executed by the processor 110 or data. For instance, in this exemplary embodiment, the host memory 120 may be a dynamic random access memory (DRAM), or a static random access memory (SRAM) or the like. Nevertheless, it should be understood that the disclosure is not limited in this regard, and the host memory 120 may also be other appropriate memories.

The storage unit 210 is configured to execute a plurality of logic gates or control commands, which are implemented in a hardware form or in a firmware form and to perform operations of writing, reading or erasing data in the rewritable non-volatile memory storage module 220 according to the commands of the host system 10.

More specifically, the processor 211 in the storage controller 210 is a hardware with computing capabilities, which is configured to control the overall operation of the storage controller 210. Specifically, the processor 211 has a plurality of control commands, and the control commands are executed to perform various operations such as writing, reading and erasing data during operation of the storage device 20.

It should be noted that, in this embodiment, the processor 110 and the processor 211 are, for example, a central processing unit (CPU), a micro-processor, other programmable microprocessors, a digital signal processor (DSP), a programmable controller, an application specific integrated circuits (ASIC), a programmable logic device (PLD) or other similar circuit elements. The disclosure is not limited in this regard.

In an embodiment, the storage controller 210 further includes a ROM (not illustrated) and a RAM (not illustrated). More particularly, the ROM has a boot code, which is executed by the processor 221 to load the control commands stored in the rewritable non-volatile memory module 220 into the RAM of the storage controller 210 when the storage controller 210 is enabled. Then, the control commands are executed by the processor 211 to perform operations, such as writing, reading or erasing data. In another embodiment, the control commands of the processor 211 may also be stored as program codes in a specific area (for example, physical storage units in the rewritable non-volatile memory module 220 dedicated for storing system data) of the rewritable non-volatile memory module 220.

In this embodiment, as described above, the storage controller 210 further includes the data management circuit 212 and the memory interface control circuit 213. It should be noted that the operations performed by each part of the storage controller 210 may also be considered as the operations performed by the storage controller 210.

The data management circuit 212 is coupled to the processor 211, the memory interface control circuit 213 and the connection interface circuit 230. The data management circuit 212 is configured to transmit data under instruction of the processor 211. For example, the data may be read from the host system 10 (e.g., the host memory 120) through the connection interface circuit 230, and the read data may be written into the rewritable non-volatile memory module 220 through the memory interface control circuit 213 (e.g., a writing operation performed according to a write command from the host system 10). As another example, the data may be read from one or more physical units of the rewritable non-volatile memory module 220 through the memory interface control circuit 213 (the data may be read from one or more memory cells in one or more physical units), and the read data may be written into the host system 10 (e.g., the host memory 120) through the connection interface circuit 230 (e.g., a reading operation performed according to a read command from the host system 10). In another embodiment, the data management circuit 212 may also be integrated into the processor 211.

The memory interface control circuit 213 is configured to perform the writing (or, programming) operation, the reading operation and the erasing operation for the rewritable non-volatile memory module 220 together with the data management circuit 212 under instruction of the processor 211.

For instance, the processor 211 may execute a write command sequence to instruct the memory interface control circuit 213 to write the data into the rewritable non-volatile memory module 220, the processor 211 may execute a read command sequence to instruct the memory interface control circuit 213 to read the data from one or more physical units corresponding to the read command in the rewritable non-volatile memory module 220, and the processor 211 may execute an erase command sequence to instruct the memory interface control circuit 213 to perform the erasing operation for the rewritable non-volatile memory module 220. Each of the write command sequence, the read command sequence and the erase command sequence may include one or more program codes or command codes, which are configured to perform the corresponding writing, reading and erasing operations on the rewritable non-volatile memory module 220. In an embodiment, the processor 211 may further issue other types of command sequences to the memory interface control circuit 213 to perform a corresponding operation on the rewritable non-volatile memory module 220.

In addition, data to be written to the rewritable non-volatile memory module 220 is converted into a format acceptable by the rewritable non-volatile memory module 220 through the memory interface control circuit 213. Specifically, if the memory management circuit 211 is to access the rewritable non-volatile memory module 220, the processor 211 may transmit a corresponding command sequence to the memory interface control circuit 213 to instruct the memory interface control circuit 213 to execute a corresponding operation. For example, the command sequences may include a write command sequence for instructing to write data, a read command sequence for instructing to read data, an erase command sequence for instructing to erase data, and other corresponding command sequences for instructing various memory operations (for example, changing read voltage levels of a plurality of read voltages of read voltage sets, performing a read voltage optimization operation, etc.). These command sequences may include one or more signals or data on the bus. The signals or data may include instruction codes or program codes. For example, the read command sequence may include information, such as a read identification code, a memory address and so on.

The rewritable non-volatile memory module 220 is coupled to the storage controller 210 (the memory control circuit unit 213) and configured to store data written by the host system 10. The rewritable non-volatile memory module 220 may be a single level cell (SLC) NAND flash memory module (i.e., a flash memory module capable of storing one bit in one memory cell), a multi level cell (MLC) NAND flash memory module (i.e., a flash memory module capable of storing two bits in one memory cell), a triple level cell (TLC) NAND flash memory module (i.e., a flash memory module capable of storing three bits in one memory cell), a quadruple level cell (QLC) NAND flash memory module (i.e., a flash memory module capable of storing four bits in one memory cell), a 3D NAND flash memory module or a vertical NAND flash memory module, other flash memory modules or any memory module having the same features. The memory cells in the rewritable non-volatile memory module 220 are disposed in an array.

In this embodiment, the rewritable non-volatile memory module 220 has a plurality of word lines, wherein each word line among the word lines includes a plurality of memory cells (a plurality of memory cells corresponding to a word line are electrically connected to the word line). The memory cells on the same word line constitute one or more physical programming units (physical pages). In addition, a plurality of physical programming units may constitute one physical unit (a physical block or a physical erasing unit). In this embodiment, the TLC (Triple Level Cell) flash memory module is taken as an example for description. That is to say, in the following embodiment, one memory cell capable of storing three bit values is used as one physical programming unit (i.e., in each programming operation, the data is programmed by applying a programming voltage on the physical programming units one by one). Here, each memory cell may be grouped into a lower physical page, a middle physical page and an upper physical page, each of which is capable of storing one bit value.

In this embodiment, the memory cell is used as a minimum unit for writing (programming) data. The physical unit is a minimum unit for erasing. Namely, each physical unit includes a minimum number of memory cells to be erased together. Each physical unit includes multiple memory cells. In the following embodiments, examples in which one physical block serves as one physical unit are provided. However, in another embodiment, one physical unit may also refer to a combination of any number of memory cells, depending on practical requirements. Further, it should be understood that, when the processor 211 groups the memory cells (or the physical units) in the rewritable non-volatile memory module 220 for performing the corresponding management operations, the memory cells (or the physical units) are logically grouped and their actual locations are not changed.

It should be noted that in this embodiment, the system data for recording the information of one physical unit may be recorded by utilizing one or more memory cells in the physical unit or by utilizing one or more memory cells in a specific physical unit dedicated for recording all the system data in a system area. In this embodiment, the system data corresponding to the physical unit includes information, such as a program erase cycle (PEC), a data retention timestamp (DRP), a read counter value and so on, of the physical unit. More specifically, every time when the processor 211 performs the erasing operation on a physical unit, the processor 211 may add "1" to the PEC value currently corresponding to the physical unit after the erasing operation is completed (for example, the PEC value may add up from "0" along with each erasing operation). In other words, the program erase cycle value may reflect a sum of times that the corresponding physical unit is erased. The DRT is used for indicating the time for which data is stored in the corresponding physical unit. Sizes (e.g., value differences) of the timestamps may be used to indicate a temporal sequence. The disclosure does not intend to limit a detailed format of the timestamp. Every time when the writing operation is performed on the physical unit, the processor 211 may update the DRT of the physical unit to be the time at which the writing operation is performed on the physical unit. In other words, the DRT corresponding to a physical unit is used for indicating the time at which the latest writing operation is performed on the physical unit (e.g., a local time at which the latest writing operation is completed). The writing operation includes, for example, programming data to one or more memory cells of the physical unit or, for example, programming data to another type of physical address of the physical unit. Then, the processor 211 may calculate how long the data has been stored in the physical unit since the previous writing operation based on the DRT. The read counter value serves to calculate the number of times that the corresponding physical unit is read, and the read counter value is cleared when the corresponding physical unit is erased.

For instance, in this embodiment, the processor 211 may group a plurality of physical units into a plurality of physical unit groups based on a statistical value of the physical units of the rewritable non-volatile memory module 220. The statistical value includes one or a combination of the information, such as the PEC value, the DRT (also referred to as a retention value) and the read counter value. The physical units grouped into the same physical unit group may have similar physical properties. The processor 211 may perform data reading on the physical units grouped into the same physical unit group through the same read voltage set (for example, issue the read command sequence by using the same read voltage set to perform the read operation to the physical units belonging to the same physical unit group).

In other embodiments, the processor 211 may group a plurality of word lines of the rewritable non-volatile memory module 220 into a plurality of word line sets based on a statistical value of the word lines (the processor 211 may calculate the statistical value of each of the word lines), and the word lines grouped into the same word line set may have similar physical properties, so as to be read through the same read voltage set (i.e., corresponding optimized read voltages) in the way as the previous embodiment does. It should be noted that in order to perform the read voltage optimization operation corresponding to each of the word lines (instead of each of the physical units) on each of the word lines, the read voltage optimization operation for each of the word lines and a read voltage optimization method of the operation are described in the following embodiment. However, for an embodiment having multiple physical unit groups, the processor 211 may select a word line of a physical unit from each of the physical unit groups to perform the read voltage optimization operation or select a physical unit from each of the physical unit groups to perform the read voltage optimization operation.

The storage controller 210 may assign a plurality of logical units to the rewritable non-volatile memory module 220. The host system 10 may access user data stored in the physical units through the assigned logical units. In this case, each logical unit may be formed by one or more logical addresses. For example, the logical unit may be a logical block, a logical page, or a logical sector. One logical unit may be mapped to one or more physical units. The logical unit may be one or more physical addresses, one or more physical sectors, one or more physical programming units, or one or more physical erasing units. In this embodiment, the logical unit is a logical block, and a logical sub-unit is a logical page. Each logical unit has a plurality of logical sub-units.

In addition, the storage controller 210 may establish a logical to physical address mapping table and a physical to logical address mapping table to record the mapping relations between the addresses assigned to the logical units (e.g., the logical blocks, the logical pages or the logical sectors) of the rewritable non-volatile memory module 220 and the addresses assigned to the physical units (e.g., the physical erasing units, the physical programming units or the physical sectors). In other words, the storage controller 210 may look up for a physical unit mapped to a logical unit based on the logical to physical address mapping table, and the storage controller 210 may look up for a logical unit mapped to a physical unit based on the physical to logical address mapping table. However, the technical concepts concerning the mapping between the logical units and the physical units are common technical means familiar to people having ordinary skills in the art and thus, will not be repeatedly described here.

In this embodiment, an error checking and correcting circuit 214 is coupled to the processor 211 and configured to perform an error checking and correction procedure to ensure accuracy of data. Specifically, when the processor 211 receives a writing command from the host system 10, the error checking and correcting circuit 214 may generate a corresponding error correcting code (ECC) and/or error detecting code (EDC) for data corresponding to the write command, and the processor 211 may write the data and the corresponding ECC and/or EDC to the rewritable non-volatile memory module 220. Thereafter, when reading data from the rewritable non-volatile memory module 220, the processor 211 may simultaneously read the ECC or EDC corresponding to the data, and the error checking and correcting circuit 214 may perform the error checking and correcting procedure on the read data based on the ECC and/or EDC. Moreover, after the error checking and correcting procedure, the error checking and correcting circuit 214 may return an error bit value to the processor 211 if the read data is successfully decoded.

In an embodiment, the storage controller 210 may further include a buffer memory 216 and a power management circuit 217. The buffer memory is coupled to the processor 211 and configured to temporarily store data and commands from the host system 10, data from the rewritable non-volatile memory module 220 or other system data for managing the storage device 20, such that the processor 211 may rapidly access the data, the commands or the system data from the buffer memory 216. The power management circuit 217 is coupled to the memory management circuit 211 and configured to control the power of the storage device 20.

In this embodiment, a read voltage management circuit unit 215 includes an abnormal Gray code counter circuit 2151 and a read voltage optimization circuit 2152. To be more specific, the processor 211 may select a word line (also referred to as a target word line) among a plurality of word lines belonging to a plurality of physical units of the rewritable non-volatile memory module 220 at a specific time point and instruct the read voltage management circuit unit 215 to perform the read voltage optimization operation on the target word line. It should be noted that the read voltage management unit 215 is configured to manage a plurality of read voltage sets corresponding to the word lines. An operation performed by each component of the read voltage management unit 215 is considered as an overall operation on the read voltage management unit 215.

For instance, the processor 211 may select a target word line from all of the word lines to perform the read voltage optimization operation when (1) the storage device 20 is idle (i.e., the storage device 20 is idle over a predetermined time threshold), (2) the storage device is powered on, or (3) when the number of error bits in data read from a word line exceeds an error bit number threshold. The processor 211 may select a word line from a word line set with a less preferable physical state (e.g., a word line set having more program erase cycles, a greater read counter value, a longer retention time or a greater number of error bits) as the target word line based on one or a combination of the statistical values and the numbers of error bits of all the word line sets. Specifically, it is assumed that the processor currently performs the read voltage optimization operation on one of the word line sets (also referred to as a target word line set). The processor 211 may first select a target word line to perform the read voltage optimization operation. The target word line may be selected from a plurality of word lines of the target word line set according to a specific selection condition. The specific selection condition may include (1) a statistical value of the target word line being close to an average of the statistical values of all the word lines belonging to the word line set which the target word line belongs to, (2) the number of error bits of the target word line being a minimum among all the word lines of the word line set which the target word line belongs to, or (3) a word line being randomly selected as the target word line. It should be noted that all of the target memory cells of the target word line are programmed, i.e., all of the target memory cells store data.

Specifically, a plurality of memory cells of each of the word lines are configured to be programmed to store a bit value corresponding to one of different Gray codes, a total number of the Gray codes is N, and N is a first predetermined positive integer greater than 2. In other words, the memory cells of the target word line may store the bit values respectively corresponding to different Gray codes. Details related to the Gray codes and Gray code indexes corresponding thereto will be described with reference to FIG. 5A.

Figure 5A:
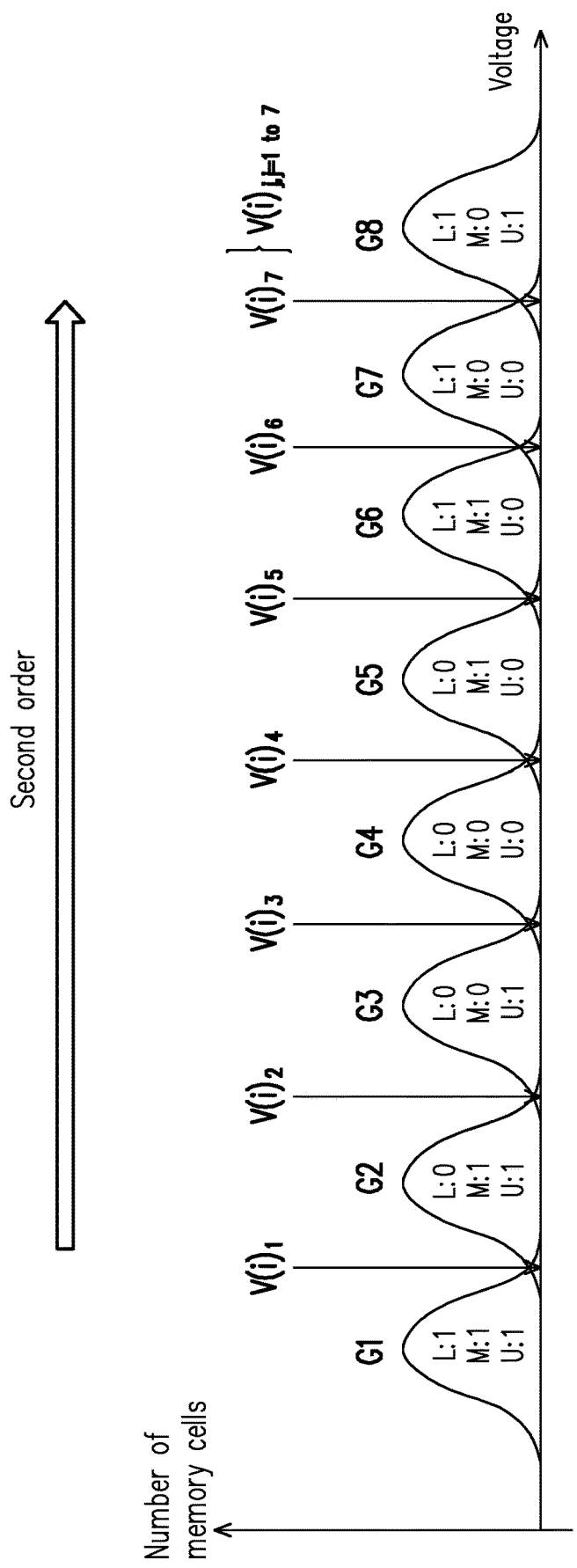
FIG. 5A is a schematic diagram illustrating threshold voltage distributions of a plurality of memory cells corresponding to the N Gray codes and a plurality of corresponding Gray code indexes according to an embodiment of the disclosure.

FIG. 5A is a schematic diagram illustrating threshold voltage distributions of a plurality of memory cells corresponding to the N Gray codes and a plurality of corresponding Gray code indexes according to an embodiment of the disclosure. In this embodiment, the TLC NAND flash memory module is taken as an example for description, wherein N is 8 (i.e., $2^3$). Each of the memory cells of the TLC NAND flash memory module has three physical pages for respectively storing bit data. Each of the memory cells may store a lower physical page (L), a middle physical page (M) and an upper physical page (U), each of which is capable of storing a bit value. It should be noted that according to the type of the rewritable non-volatile memory module 220, N may be a predetermined positive integer greater than 2 (also referred to as a second predetermined positive integer). For example, if the rewritable non-volatile memory module 220 is an MLC NAND flash memory module, N=4, if the rewritable non-volatile memory module 220 is a SLC NAND flash memory module, N=2, and if the rewritable non-volatile memory module 220 is a QLC NAND flash memory module, N=16.

It is assumed that the processor 211 reads a plurality of target memory cells of a target word line of the TLC NAND flash memory module through a plurality of read voltages V(i)1 to V(i)7 of a read voltage set V(i) and thereby, identifies different bit values (bit values respectively corresponding to different Gray codes) stored by the target memory cells.

A gate voltage in each of the memory cells may be classified into 8 Gray codes according to the read voltages $V(1)_1$ to $V(1)_7$ of a first read voltage set sorted in a second order, for example, "L:1 M:1 U:1", "L:0 M:1 U:1", "L:0 M:0 U:1", "L:0 M:0 U:0", "L:0 M:1 U:0", "L:1 M:1 U:0", "L:1 M:0 U:0" and "L:1 M:0 U:1" (wherein "L:" represents a bit value of the lower physical page, "M:" represents a bit value of the middle physical page, "U:" represents a bit value of the upper physical page). The 8 Gray codes may also be represented as 8 bit value combinations, i.e., "111", "011", "001", "000", "010", "110", "100" and "101". An order of the bit values in each of the bit value combinations is in accordance with the order of the upper, middle, and lower physical pages. That is to say, by respectively applying the read voltages $V(i)_1$ to $V(i)_7$ having different voltage values in the first read voltage set V(i) to one of the memory cells of the target word line, the processor 211 may determine whether a channel of the memory cell is turned on to respectively determine that a bit value (also referred to as bit data or a read bit value) stored in the memory cell corresponds to one of the different Gray codes (i.e., "111", "011", "001", "000", "010", "110", "100" and "101") (i.e., the bit value is read from one of the memory cells of the target word line by using the first read voltage set V(i)). For example, the Gray code "111" and the Gray code "011" may be distinguished by the read voltage V(i)i (i.e., the left of the read voltage V(i)i is a threshold voltage distribution corresponding to the Gray code "111", and the right of the read voltage V(i)i is a threshold voltage distribution corresponding to the Gray code "011").

It should be noted that as the memory cells in the rewritable non-volatile memory module 220 may have multiple number of the Gray codes (which is 8 in this example), the number of the read voltages $V(i)_1$ to $V(i)_7$ in the read voltage set V(i) is the number of the Gray codes minus one (which is 7 in this example, i.e., N−1=8−1=7). A plurality of read voltages of a read voltage set include (N−1) read voltages which are arranged from the minimum to the maximum (from the left to the right) from the first to the (N−1)$^{th}$ according to voltage levels.

It should be noted that the N Gray codes may be N corresponding Gray code indexes which are set (through the processor 211 or the read voltage management unit 215) according to sizes of the corresponding threshold voltage distributions. For example, as illustrated in FIG. 5A, the threshold voltage distribution corresponding to the Gray code "111" is the minimum (the leftmost), and a Gray code index G1 corresponding to the Gray code "111" may be set as "1". The threshold voltage distribution corresponding to the Gray code "101" is the maximum (the rightmost), and a Gray code index G8 corresponding to the Gray code "101" may be set as "8". That is to say, in this example, the processor 211 (or the read voltage management unit 215) may set Gray code indexes G1, G2, G3, G4, G5, G6, G7 and G8 corresponding to the Gray codes "111", "011", "001", "000", "010", "110", "100" and "101" as "1", "2", "3", "4", "5", "6", "7" and "8". It should be noted that the disclosure is not intent to limit the setting values of the Gray code indexes G1, G2, G3, G4, G5, G6, G7 and G8.

In this embodiment, the setting values of the Gray code indexes G1, G2, G3, G4, G5, G6, G7 and G8 have to comply with a rule. The aforementioned rule refers to that the set Gray code indexes G1, G2, G3, G4, G5, G6, G7 and G8 have a relative number value relationship among one another, i.e., G1<G2<G3<G4<G5<G6<G7<G8.

It is to be mentioned that in this embodiment, the threshold voltage distributions of the memory cells of the word line are more likely to have abnormal phenomenon (for example, shifts) than default threshold voltage distributions. Due to the abnormality in the threshold voltage distributions, default read voltage sets previously corresponding to the default threshold voltages are no longer suitable for reading the word line having the threshold voltage distributions which have shifted. If the default read voltage sets continues to be used by the processor to read the word line where the abnormality occurs to the threshold voltage distributions, it may cause error to the read data. Accordingly, it is necessary to find out an optimized read voltage set suitable for the current threshold voltage distribution, wherein a plurality of optimized read voltages of the optimized read voltage set may be close to a junction (e.g., $V(i)_1$ to $V(i)_7$ illustrated in FIG. 5A) between two adjacent threshold voltage distributions.

Details about how the read voltage management unit 215 performs the read voltage optimization operation on the target word line (through the data reading method provided herein, which may also referred to as a read voltage optimization method) and functions of the abnormal Gray code counter circuit 2151 and the read voltage optimization circuit 2152 will be specifically described with reference to several drawings hereinafter.

Figure 2:
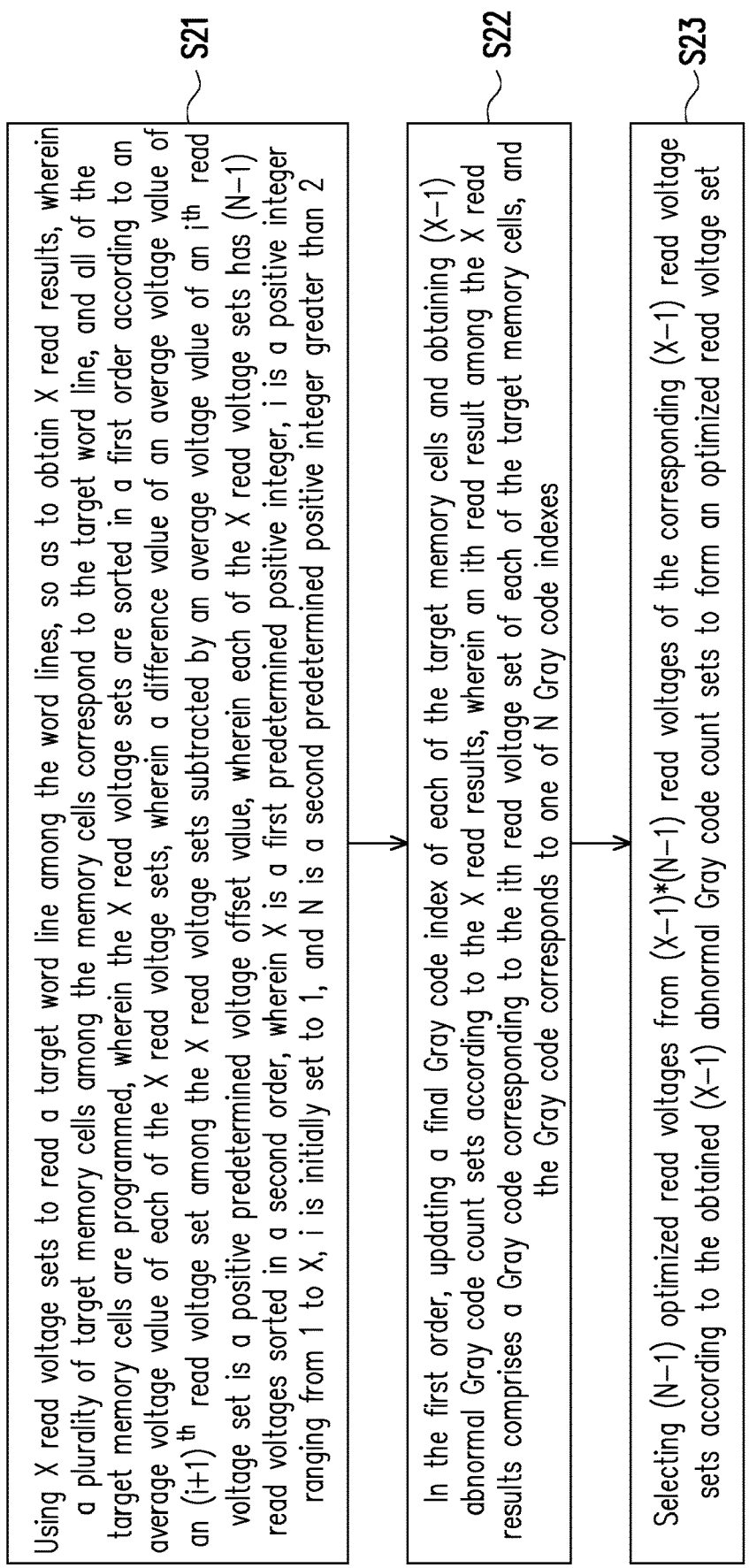
FIG. 2 is a flowchart of a data reading method according to an embodiment of the disclosure.

FIG. 2 is a flowchart of a data reading method according to an embodiment of the disclosure. Referring to FIG. 1 and FIG. 2 at the same time, in step S21, the read voltage management unit 215 (or the abnormal Gray code counter circuit 2151) uses X read voltage sets to read the target word line, so as to obtain X read results. The target word line includes a plurality of target memory cells. The X read voltage sets are arranged in a first order according to the magnitude of an average voltage value of each of the X read voltage sets. A difference value of the average voltage value of an $(i+1)^{th}$ read voltage set among the X read voltage sets deducted by the average voltage value of an $i^{th}$ read voltage set is a positive predetermined voltage offset value. Each of the X read voltage sets has (N−1) read voltages sorted in a second order. X is a first predetermined positive integer, i is a positive integer ranging from 1 to X and initially set to 1, and N is a second predetermined positive integer greater than 2. The X read voltage sets will be described with reference to FIG. 5B hereinafter.

Figure 5B:
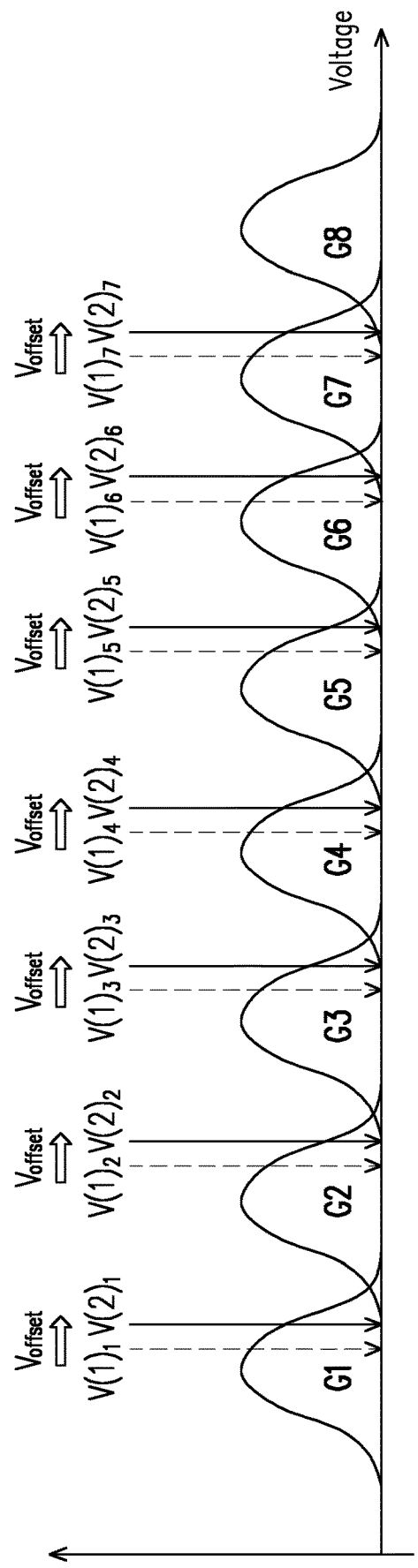
FIG. 5B is a schematic diagram illustrating adjacent read voltage sets according to an embodiment of the disclosure.

FIG. 5B is a schematic diagram illustrating adjacent read voltage sets according to an embodiment of the disclosure. Referring to FIG. 5B, it is assumed that a first read voltage set V(1) is the first one among the X read voltage sets, and a second read voltage set V(2) is the second one among the X read voltage sets. A voltage difference between the two adjacent read voltage sets is a predetermined voltage offset value ($V_{offset}$). For example, the voltage difference between a first read voltage $V(2)_1$ of the second read voltage set and a first read voltage $V(1)_1$ of the corresponding first read voltage set is the predetermined voltage offset value ($V_{offset}$), i.e., the difference value of a voltage value of the read voltage $V(2)_1$ subtracted by a voltage value of the read voltage $V(1)_1$ is equal to $V_{offset}$. In other words, a difference value of an average voltage value of the read voltage set V(2) subtracted by an average voltage value of the read voltage set V(1) is the predetermined voltage offset value. In this embodiment, the read voltages in the X read voltage sets may be sorted in the first order (based on the average voltage values from small to large), i.e., the average voltage value of the first read voltage set among the X read voltage sets is the minimum, and the average voltage value of the last read voltage set among the X read voltage sets is the maximum.

It is to be mentioned that in response to the selected target word line, the read voltage management unit 215 may identify a plurality of statistical values of the target word line and adjust the predetermined voltage offset value and the value (i.e., X) of the first predetermined positive integer according to at least one of the statistical values. The statistical values include a PEC value of the target word line, a read counter value of the target word line, a retention time value of the target word line and the number of error bits of data stored in the target word line. Specifically, if one of the statistical values indicates that a physical condition of the target word line is less preferable (e.g., the target word line has a higher number of error bits or a greater PEC value), the read voltage management circuit unit 215 may use a smaller predetermined voltage difference and more first predetermined positive integers to search for the optimized read voltage set in a more fine-grained manner by using a greater number of read voltage sets where an interval between each two sets are smaller. Or otherwise, if one of the statistical values indicates that the physical condition of the target word line is more preferable (e.g., the target word line has a lower number of error bits or a lower PEC value), the read voltage management circuit unit 215 may use a greater predetermined voltage difference and less second predetermined positive integers to search for the optimized read voltage set in a more coarse-grained manner by using a smaller number of read voltage sets where the interval between each two sets are greater.

It should be noted that the disclosure is not limited to the setting manners of the X read voltage sets. For example, in another embodiment, a manufacturer may directly set each of the X read voltage sets in advance according to requirements and/or hardware specifications of the rewritable non-volatile memory module 220. Herein, in another embodiment, manners in which the voltage values of the read voltages of each of the read voltage sets are arranged are different from one another, and the voltage difference between the each two adjacent read voltage sets in the X read voltage sets is not a fixed voltage difference. To be more detailed, the difference value between a $i^{th}$ read voltage of an $i^{th}$ read voltage set and a $j^{th}$ read voltage of an $(i+1)^{th}$ read voltage set among the X read voltage sets is not fixed, wherein j ranges from 1 to N−1 according to the second order. For example, herein, in another embodiment, it is assumed that the difference value between the first read voltage of the first read voltage set and the first read voltage of the second read voltage set is 7.5 mV, however, the difference value between the first read voltage of the first read voltage set and the first read voltage of the second read voltage set may be 6 mV, −7 mV or another voltage difference which is different from 7.5 mV.

After the X read voltage sets are determined, the read voltage management unit 215 may use the X read voltage sets to read the target word line, so as to obtain X read results. For example, the read voltage management unit 215 may, in the first order (e.g., 1 to X), first use the first read voltage set among the X read voltage sets, i.e., the read voltage set V(1), to read the target word line, so as to obtain a first read result corresponding to the read voltage set and then, may use the second read voltage set, i.e., the read voltage set V(2), among the X read voltage sets to read the target word line, so as to obtain a second read result corresponding to the read voltage set. In the same way, the read voltage management unit 215 may obtain the X read results.

Then, in step S22, the read voltage management circuit unit 215 (or the abnormal Gray code counter circuit 2151) may, in the first order, update a final Gray code index of each of the target memory cells and obtain (X−1) abnormal Gray code count sets according to the X read results. An $i^{th}$ read result among the X read results includes a Gray code corresponding to the $i^{th}$ read voltage set of each of the target memory cells, and the Gray code corresponds to one of N Gray code indexes.

For instance, among the X read results, the $i^{th}$ read result corresponding to the read voltage set V(i) refers to a plurality of read bit values obtained by the read voltage management unit 215 using the read voltage set V(i) to read the target memory cells of the target word line. The read bit values may be expressed in a format of Gray codes, and each of the read bit values may correspond to one of the N Gray code indexes.

Details of step S22 will be described with reference to FIG. 3.

Figure 3:
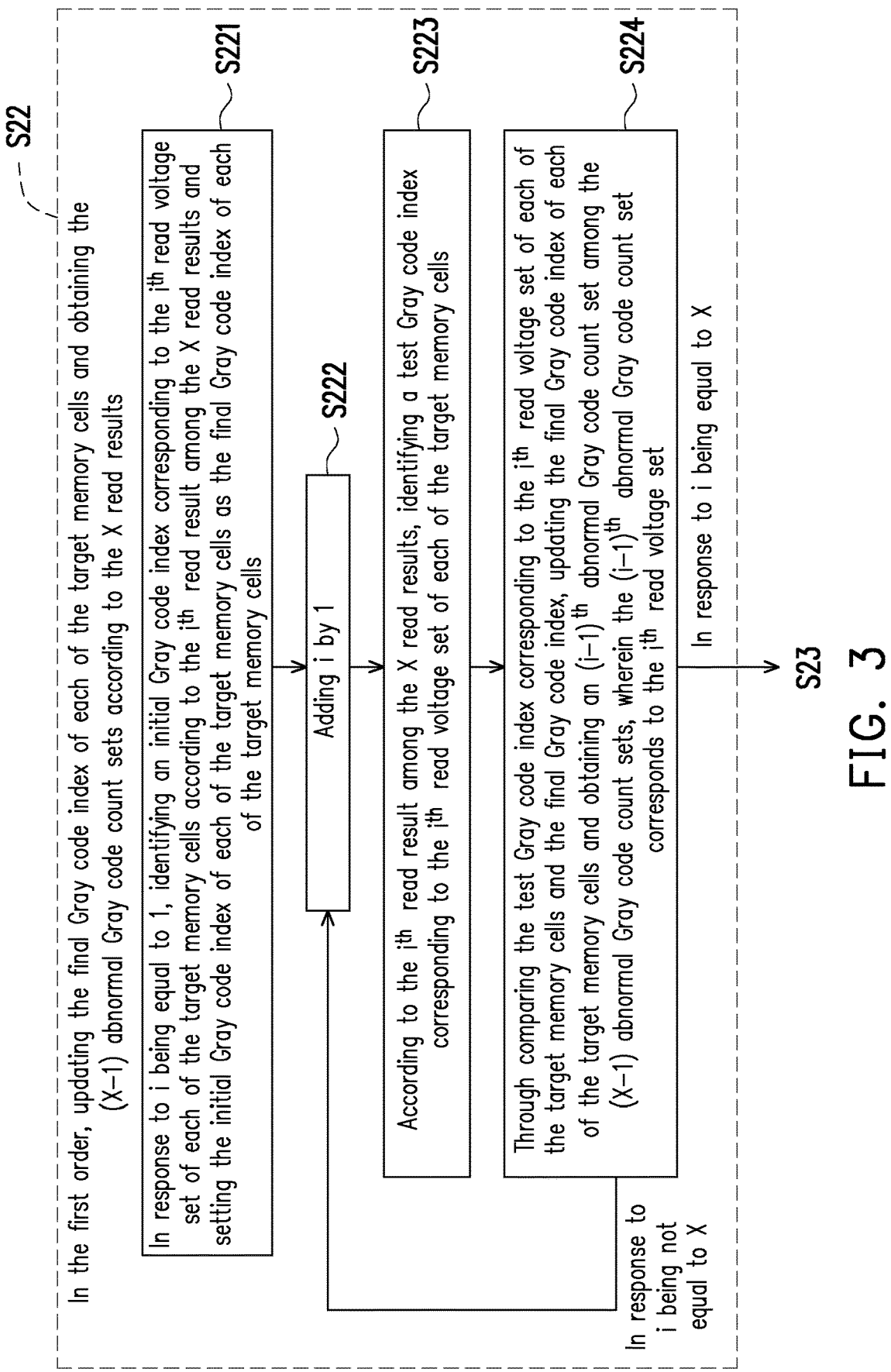
FIG. 3 is a flowchart illustrating step S22 depicted in FIG. 2 according to an embodiment of the disclosure.

FIG. 3 is a flowchart of step S22 illustrated in FIG. 2 according to an embodiment of the disclosure. Referring to FIG. 3, in step S221, in response to i being equal to 1, the abnormal Gray code counter circuit 2151 identifies an initial Gray code index corresponding to the $i^{th}$ read voltage set of each of the target memory cells according to the $i^{th}$ read result among the X read results and sets the initial Gray code index of each of the target memory cells as the final Gray code index of each of the target memory cells. Specifically, when i is equal to 1, the $i^{th}$ read result is the first read result among the X read results and corresponds to the first read voltage set among the X read voltage sets. In addition, the first read result among the X read results is used to initially set the final Gray code index of each of the target memory cells.

In step S222, the abnormal Gray code counter circuit 2151 adds i by 1, i.e., the abnormal Gray code counter circuit 2151 continues to process a next read result. For example, in step S221, the final Gray code index of each of the target memory cells has been set according to the first read result. Then, the abnormal Gray code counter circuit 2151, in step S222, continues to identify the next read result to perform subsequent steps S223 and S224.

In step S223, the abnormal Gray code counter circuit 2151 identifies a test Gray code index corresponding to the $i^{th}$ read voltage set of each of the target memory cells according to the $i^{th}$ read result among the X read results. In other words, the final Gray code index of each of the target memory cells has been set, and the abnormal Gray code counter circuit 2151 identifies the Gray code index corresponding to the $i^{th}$ read voltage set of each of the target memory cells according to the $i^{th}$ read result corresponding to the $i^{th}$ read voltage set and configure the Gray code index as the test Gray code index of each of the target memory cells. The test Gray code index will be used in a subsequent abnormality inspection procedure (step S224).

Then, in step S224, the abnormal Gray code counter circuit 2151 compares the test Gray code index corresponding to the $i^{th}$ read voltage set of each of the target memory cells and the final Gray code index to update the final Gray code index of each of the target memory cells and obtain an $(i-1)^{th}$ abnormal Gray code count set among the (X-1) abnormal Gray code count sets. The $(i-1)^{th}$ abnormal Gray code count set corresponds to the $i^{th}$ read voltage set. Details of step S224 will be described with reference to FIG. 4. Step S224 may also referred to as the abnormality inspection procedure.

Figure 4:
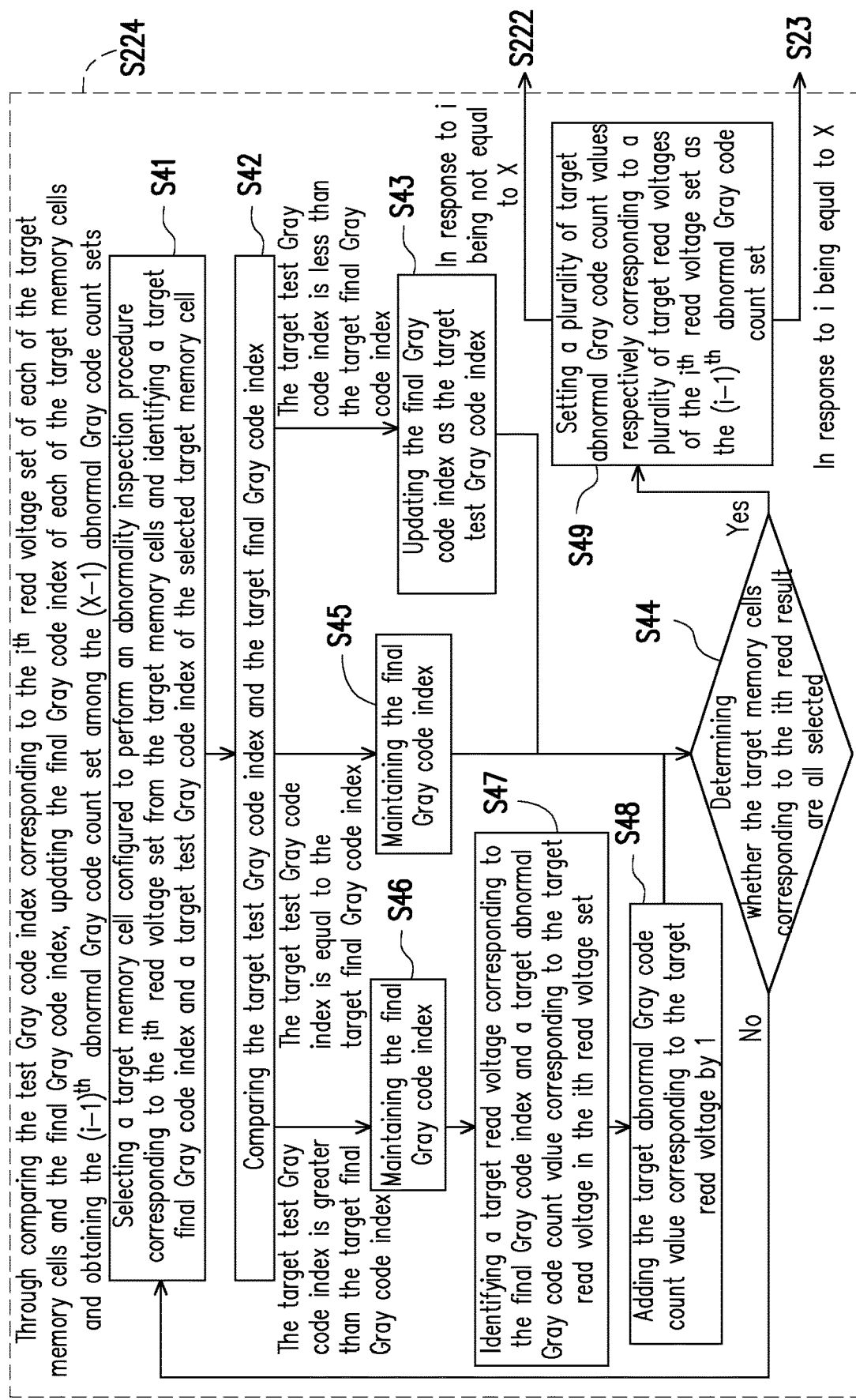
FIG. 4 is a flowchart of step S224 illustrated in FIG. 3 according to an embodiment of the disclosure.

FIG. 4 is a flowchart of step S224 depicted in FIG. 3 according to an embodiment of the disclosure. Referring to FIG. 4, in step S41, the abnormal Gray code counter circuit 2151 selects a target memory cell configured to perform the abnormality inspection procedure corresponding to the $i^{th}$ read voltage set from the target memory cells and identifies a target final Gray code index and a target test Gray code index of the selected target memory cell. Specifically, the abnormal Gray code counter circuit 2151 performs inspection on all of the target memory cells in the target word line one by one (for example, sequentially inspects all of the target memory cells according to an order of a memory cell identification code of each of the memory cells). The abnormal Gray code counter circuit 2151 identifies the final Gray code index (also referred to as the target final Gray code index) and the test Gray code index (also referred to as the target test Gray code index) of the selected target memory cell. For instance, if it is assumed that i is equal to 2, the abnormal Gray code counter circuit 2151 may identify the final Gray code index of the selected target memory cell which is set/updated in the previous read result (e.g., the first read voltage set corresponding to the first read voltage set). In addition, the abnormal Gray code counter circuit 2151 may identify the test Gray code index of the selected target memory cell according to the current read result (e.g., the second read voltage set corresponding to the second read voltage set). Then, in step S42, the abnormal Gray code counter circuit 2151 compares the target test Gray code index and the target final Gray code index. Details of steps S41 and S42 will be described with reference to FIG. 6A and FIG. 6B.

Figure 6A:
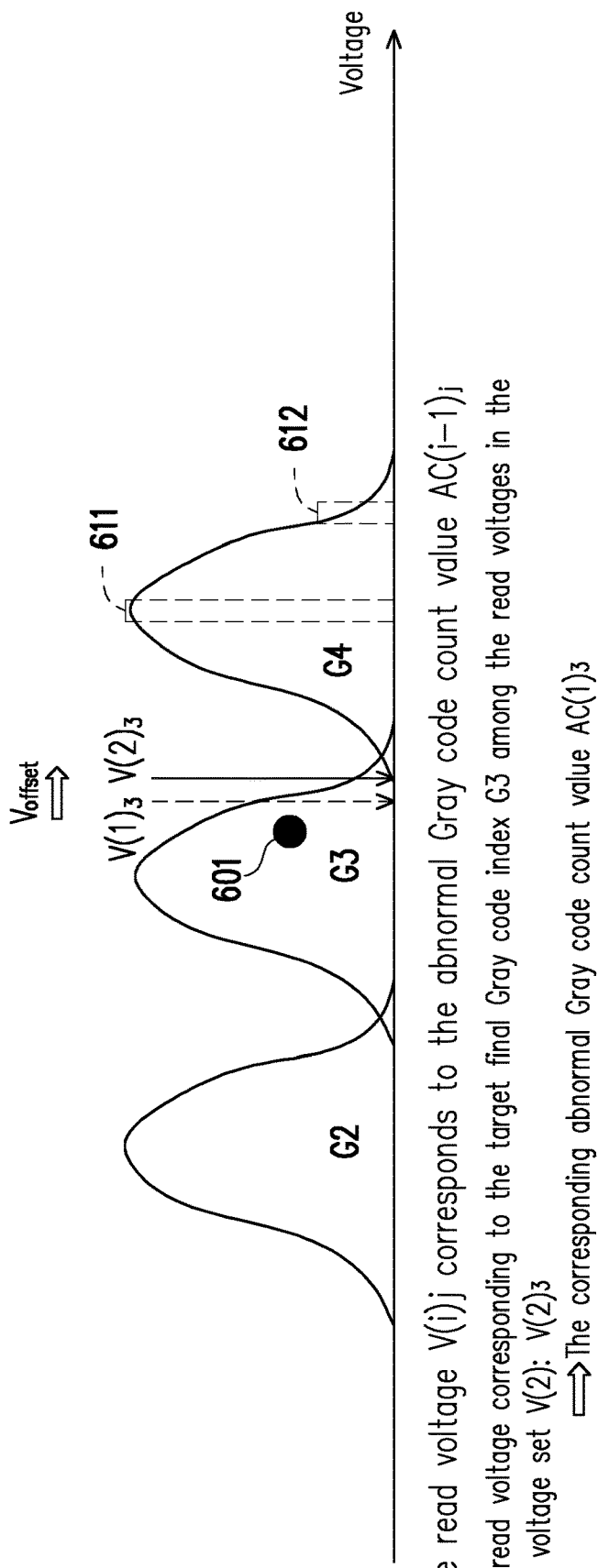

FIG. 6A and FIG. 6B are schematic diagrams illustrating the determination of the final Gray code index and the abnormal Gray code count value according to an embodiment of the disclosure. Referring to FIG. 6A first, for instance, it is assumed that when i is equal to 1, according to the third read voltage $V(1)_3$ of the read voltage set V(1), the abnormal Gray code counter circuit 2151 identifies that a read bit value of a memory cell 601 corresponds to the Gray code index G3, and the abnormal Gray code counter circuit 2151 sets the Gray code index G3 as a final Gray code index of the memory cell 601 (for example, referring to step S221). Then, when i is equal to 2 (i.e., i+1=2) (for example, referring to step S222), according to the third read voltage $V(2)_3$ of the read voltage set V(2) (the difference value of the voltage value of the read voltage $V(2)_3$ subtracted by the voltage value of the read voltage $V(1)_3$ is the predetermined voltage offset value $V_{offset}$), the abnormal Gray code counter circuit 2151 identifies a test Gray code index of the memory cell 601 according to the second read result and also identifies the set final Gray code index of the memory cell 601 (for example, referring to step S41).

Then, in step S42, the abnormal Gray code counter circuit 2151 compares the target test Gray code index and the target final Gray code index. Specifically, the abnormal Gray code counter circuit 2151 compares the target test Gray code index and the target final Gray code index by using a plurality of inspection rules, so as to obtain inspection results. Referring to FIG. 6B, the inspection rules are represented in a manner of a rule table T610. Specifically, after the values of the target test Gray code index and the target final Gray code index are compared, in response to the test Gray code index of the selected target memory cell being "less than" the final Gray code index (step S42→step S43), the abnormal Gray code counter circuit 2151 determines to update the final Gray code index, without accumulating the abnormal Gray code count value of the corresponding read voltage. In response to the test Gray code index of the selected target memory cell being "equal to" the final Gray code index (step S42→step S45), the abnormal Gray code counter circuit 2151 determines not to update the final Gray code index and not to accumulate the abnormal Gray code count value of the corresponding read voltage. In response to the test Gray code index of the selected target memory cell being "greater than" the final Gray code index (step S42→step S46), the abnormal Gray code counter circuit 2151 determines not to update the final Gray code index, and accumulate the abnormal Gray code count value of the corresponding read voltage.

For instance, following the example set forth above, it is assumed that a target final Gray code index of the memory cell 601 is the Gray code index G3 (e.g., 3). If a target test Gray code index of the memory cell 601 is the Gray code index G4 (e.g., 4), the abnormal Gray code counter circuit 2151 determines not to update the target final Gray code index of the memory cell 601, but accumulate the corresponding abnormal Gray code count value. If the target test Gray code index of the memory cell 601 is the Gray code index G3 (e.g., 3), the abnormal Gray code counter circuit 2151 determines not to update the target final Gray code index of the memory cell 601 and not to accumulate the corresponding abnormal Gray code count value. If the target test Gray code index of the memory cell 601 is the Gray code index G2 (e.g., 2), the abnormal Gray code counter circuit 2151 determines to use the Gray code index G2 to update the target final Gray code index of the memory cell 601, but not to accumulate the corresponding abnormal Gray code count value.

Returning to FIG. 4, that is to say, in response to the comparison result obtained in step S42, the entire process enters step S43, S45 or S46. If entering step S43, the abnormal Gray code counter circuit 2151, in step S43, updates the target final Gray code index as the target test Gray code index. Specifically, the abnormal Gray code counter circuit 2151 uses the target test Gray code index to replace the current target final Gray code index. In step S44, the abnormal Gray code counter circuit 2151 determines whether the target memory cells corresponding to the $i^{th}$ read result are all selected. The process subsequently proceeds to step S49 if the target memory cells corresponding to the $i^{th}$ read result are all selected. The process subsequently proceeds to step S41 if the target memory cells corresponding to the $i^{th}$ read result are not all selected (i.e., there are one or more memory cells that are still not selected to perform the abnormality inspection procedure corresponding to the $i^{th}$ read voltage set, so as to continue to select an unselected target memory cell to perform the abnormality inspection procedure corresponding to the $i^{th}$ read voltage set.

If entering step S45, the abnormal Gray code counter circuit 2151, in step S45, maintains the target final Gray code index. Namely, the abnormal Gray code counter circuit 2151 does not change the target final Gray code index of the selected target memory cell. Then, the process subsequently proceeds to step S44.

If entering step S46, the abnormal Gray code counter circuit 2151, in step S460, maintains the target final Gray code index, and the process subsequently proceeds to step S47. In step S47, the abnormal Gray code counter circuit 2151 identifies a target read voltage corresponding to the final Gray code index and a target abnormal Gray code count value corresponding to the target read voltage in the $i^{th}$ read voltage set. Specifically, based on the relationship between the Gray codes and the read voltages, the Gray code corresponding to the target final Gray code index corresponds to a read voltage of the $i^{th}$ read voltage set. For instance, referring to FIG. 6A, it is assumed that the process enters step S47 in a condition assuming that the target final Gray code index G3 of the memory cell 601 is less than the target test Gray code index G4. In this circumstance, the abnormal Gray code counter circuit 2151 identifies that the target final Gray code index G3 corresponds to the read voltage $V(2)_3$ of the read voltage set $V(2)$, and the abnormal Gray code counter circuit 2151 may identify the abnormal Gray code count value corresponding to the read voltage $V(2)_3$, for example, the abnormal Gray code count value $AC(1)_3$. Specifically, the $j^{th}$ Gray code corresponds to the $j^{th}$ read voltage (i.e., the read voltage $V(i)_j$) in the read voltage set $V(i)$, and the read voltage $V(i)_j$ corresponds to the abnormal Gray code count value $AC(i-1)_j$. It should be noted that the corresponding relationship between the Gray codes and the read voltages may vary according to the physical structure of the memory cells of the rewritable non-volatile memory module 220, and the disclosure is not limited thereto. The abnormal Gray code count value $AC(i-1)_j$ may be maintained in the abnormal Gray code counter circuit 2151 or the buffer memory 216.

After the target abnormal Gray code count value corresponding to the target read voltage is identified, in step S48, the abnormal Gray code counter circuit 2151 adds the target abnormal Gray code count value corresponding to the target read voltage by 1. Then, the process subsequently proceeds to step S44. To be more detailed, referring to FIG. 6A, it is assumed that the memory cell 601 has the target final Gray code index G3, and the memory cell 601 is identified as having the target test Gray code index G4 according to the read result of the current read voltage $V(2)_3$. In this condition, since the read voltage $V(2)_3$ is greater than the read voltage $V(1)_3$, therefore if the memory cell 601 belongs to the threshold voltage distribution (which is smaller than the read voltage $V(1)_3$) corresponding to the Gray code index G3 at the left of the read voltage $V(1)_3$, it is in fact impossible to identify that the memory cell 601 belongs to the threshold voltage distribution at the right of the read voltage $V(2)_3$, i.e., the memory cell 601 is identified as having the Gray code index G4. In other words, in case the aforementioned phenomenon that cannot possibly happen occurs, it may be determined that such phenomenon is abnormal (also referred to as an abnormal Gray code phenomenon). Accordingly, the abnormal Gray code count value corresponding to the read voltage $V(2)_3$ may be used to accumulate the number of times that such abnormality occurs.

In this embodiment, the number of the memory cells in which the abnormal Gray code phenomenon occurs may vary with the area sizes of the threshold voltage distributions of the memory cells corresponding to different Gray code indexes. For instance, taking the threshold voltage distribution corresponding to the Gray code index G4 as an example, because the threshold voltage distribution is approximate to a bell-shaped distribution, an area of a middle region 611 of the threshold voltage distribution corresponding to the Gray code index G4 is greater than an area of another region 612 of the threshold voltage distribution corresponding to the Gray code index G4. In addition, in this embodiment, as a probability that the abnormal Gray code phenomenon occurs to an arbitrary memory cell of the rewritable non-volatile memory module 220 is fixed, the abnormal Gray code phenomenon occurs more to the middle region 611 of the threshold voltage distribution corresponding to the Gray code index G4 than to the region 612 of the threshold voltage distribution corresponding to the Gray code index G4. In other words, as the abnormal Gray code count value corresponding to a specific read voltage decreases, the specific read voltage is closer to a region at either side of the threshold voltage distribution (which is also a junction between the threshold voltage distribution and another threshold voltage distribution).

Accordingly, by continuously selecting the unselected target memory cells to perform the abnormality inspection procedure, the abnormal Gray code phenomenon that occurs for one or more times may be identified, and the number of times that the abnormal Gray code phenomenon occurs to the corresponding read voltage may be accumulated by using the abnormal Gray code count values to calculate the abnormal Gray code count set of each of the read voltage sets (except for the first read voltage set), so as to find out a plurality of read voltages that are closet to the junctions between the threshold voltage distributions by using all the obtained abnormal Gray code count sets. The read voltages of the junctions between the threshold voltage distributions may be considered as a plurality of optimized read voltages. A method of identifying the optimized read voltages will be further described with reference to FIG. 8.

In response to the memory cells being all selected to perform the abnormality inspection procedure corresponding to the $i^{th}$ read voltage set, the process subsequently proceeds to step S49. In step S49, the abnormal Gray code counter circuit 2151 sets a plurality of target abnormal Gray code count values respectively corresponding to a plurality of target read voltages of the $i^{th}$ read voltage set as the $(i-1)^{th}$ abnormal Gray code count set. Following the example (where i is equal to 2) set forth above, the abnormal Gray code counter circuit 2151 may set the currently accumulated abnormal Gray code count values corresponding to the second read voltage set as the $1^{st}$ (where 2−1=1) abnormal Gray code count set (i.e., the Gray code count set AC(1)) corresponding to the second read voltage set (i.e., the read voltage set V(2)) among the (X−1) abnormal Gray code count sets. Then, in response to i being not equal to X, the process subsequently proceeds to step S222, and in response to i being equal to X, the process subsequently proceeds to step S23. The obtained abnormal Gray code count sets may be maintained in the abnormal Gray code counter circuit 2151 or the buffer memory 216.

Figure 7:
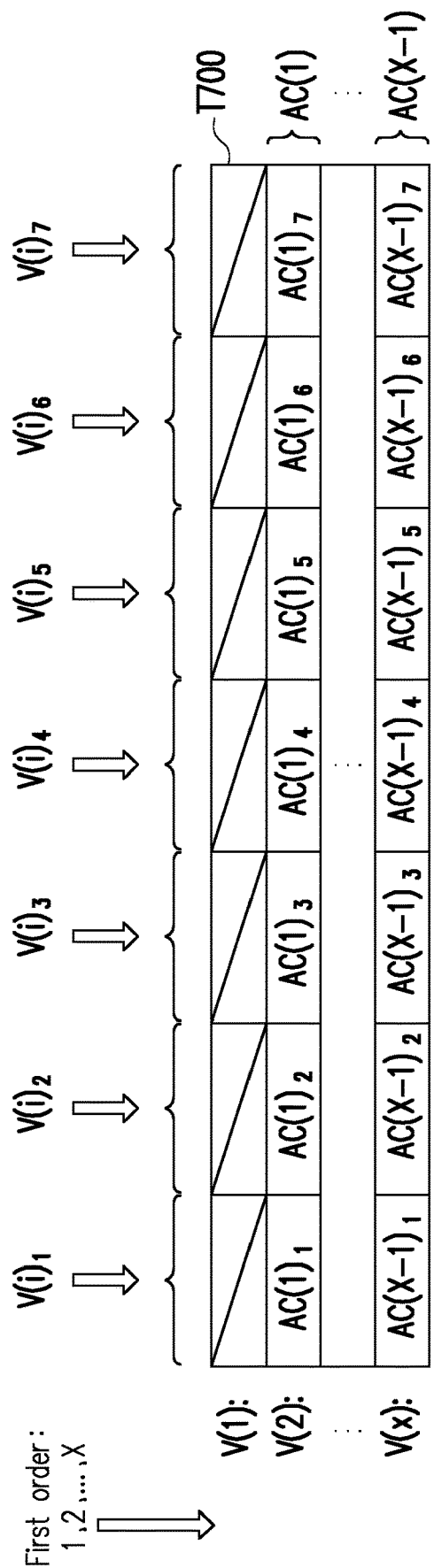
FIG. 7 is a schematic diagram illustrating the abnormal Gray code count sets according to an embodiment of the disclosure.

FIG. 7 is a schematic diagram illustrating the abnormal Gray code count sets according to an embodiment of the disclosure. For instance, referring to FIG. 7, it is assumed that the (X−1) abnormal Gray code count sets have been all set. The abnormal Gray code counter circuit 2151 may record the (X−1) abnormal Gray code count sets in a manner of, for example, the use of Table T700. It is to be mentioned that as illustrated in FIG. 7. because the read voltage set V(1) is only used to set the initial final Gray code indexes of the target memory cells of the target word line, the first read voltage set (i.e., the read voltage set V(1)) among the X read voltage sets does not have its corresponding abnormal Gray code count set.

Returning to FIG. 2, after the (X−1) abnormal Gray code count sets are obtained, step S23 follows, where the read voltage management unit 215 (or the read voltage optimization circuit 2152) selects (N−1) optimized read voltages from (X−1)*(N−1) read voltages of the corresponding (X−1) read voltage sets according to the obtained (X−1) abnormal Gray code count sets to form an optimized read voltage set. Related details will be described with reference to FIG. 8.

FIG. 8 is a schematic diagram illustrating the determination of the optimized read voltage set according to an embodiment of the disclosure. Referring to FIG. 8, it is assumed that X is 17, and N is 8. In addition, the abnormal Gray code counter circuit 2151 uses 16 read voltage sets V(2) to V(17) to read the target word line, so as to obtain 16 abnormal Gray code count sets AC(1) to AC(16) and a plurality of abnormal Gray code count values contained therein of the corresponding 17 read voltage sets V(2) to V(17) (e.g., as illustrated in Table T800). For instance, in order to find out each optimized read voltage of the optimized read voltage set, (for example, in the second order), it may start from the first read voltage $V(i)_1$, and the read voltage optimization circuit 2152 may respectively find out a minimum one (i.e., a minimum abnormal Gray code count value) (for example, the abnormal Gray code count value corresponding to the read voltage V(6)1) among the abnormal Gray code count values $AC(1)_1$ to $AC(16)_1$ of the first read voltages $V(2)_1$ to $V(17)_1$ corresponding to the read voltage sets V(2) to V(17) and select the read voltage (i.e., the read voltage $V(6)_1$) corresponding to the minimum one to be the first read voltage of the optimized read voltage set. In case there are a plurality of minimum ones, one may be randomly selected from the minimum ones (or the one arranged in the middle may be selected), and then the corresponding read voltage serves as the optimized read voltage. The other optimized read voltages of the optimized read voltage set may also be identified according to the aforementioned manner. In the same way, the finally formed optimized read voltage set may include, for example, a plurality of read voltages $\{V(6)_1, V(7)_2, V(7)_3, V(10)_4, V(7)_5, V(6)_6, V(8)_7\}$ respectively corresponding to a plurality of abnormal Gray code count values {"0", "1", "0", "1", "0", "0", "0"}.

In addition, in another embodiment, the read voltage optimization circuit 2152 may calculate a total of all the abnormal Gray code count values of each of the abnormal Gray code count sets AC(1) to AC(16) as a corresponding abnormal Gray code count value sum. For example, an abnormal Gray code count value sum of the abnormal Gray code count set AC(1) corresponding to the read voltage V(2) is 57 (i.e., 0+18+1+16+4+8+10=57). Then, the read voltage optimization circuit 2152 may select a minimum one from all the calculated abnormal Gray code count value sums and select the read voltage set corresponding to the minimum one as the optimized read voltage set. For example, in the example of Table T800, the abnormal Gray code count value sum corresponding to the read voltage set AC(6) is the minimum one among all the abnormal Gray code count value sums. Accordingly, the read voltage optimization circuit 2152 may set the read voltage set V(6) as the optimized read voltage set of the corresponding target word line.

In addition, in yet another embodiment, the read voltage optimization circuit 2152 may use a plurality of first candidate read voltage sets corresponding to the abnormal count value sums which are less than an abnormal count value sum threshold as a plurality of candidates for the optimized read voltage set. Then, the read voltage optimization circuit 2152 further selects one from the first candidate read voltage sets to serve as the optimized read voltage set of the target word line. For example, the read voltage optimization circuit 2152 may select the first candidate read voltage set having the minimum abnormal Gray code count value sum as the optimized read voltage set corresponding to the target word line.

After the optimized read voltage set corresponding to the target word line is obtained, the read voltage optimization operation corresponding to the target word line is completed. The read voltage management circuit unit 215 (or the read voltage optimization circuit 2152) may record the optimized read voltage set, such that afterwards, the recorded optimized read voltage set may be directly applied when reading other word lines having the similar physical conditions. As in another example, the other word lines in the same set may directly apply the recorded optimized read voltage set. In addition, the obtained optimized read voltage set may be directly used to read the target word line in the reading operation performed later on the target word line.

On the other hand, in another embodiment, the abnormal Gray code counter circuit 2151 may also more accurately determine a threshold voltage distribution of the target word line and the Gray code count values corresponding to different Gray code indexes.

Figure 9A:
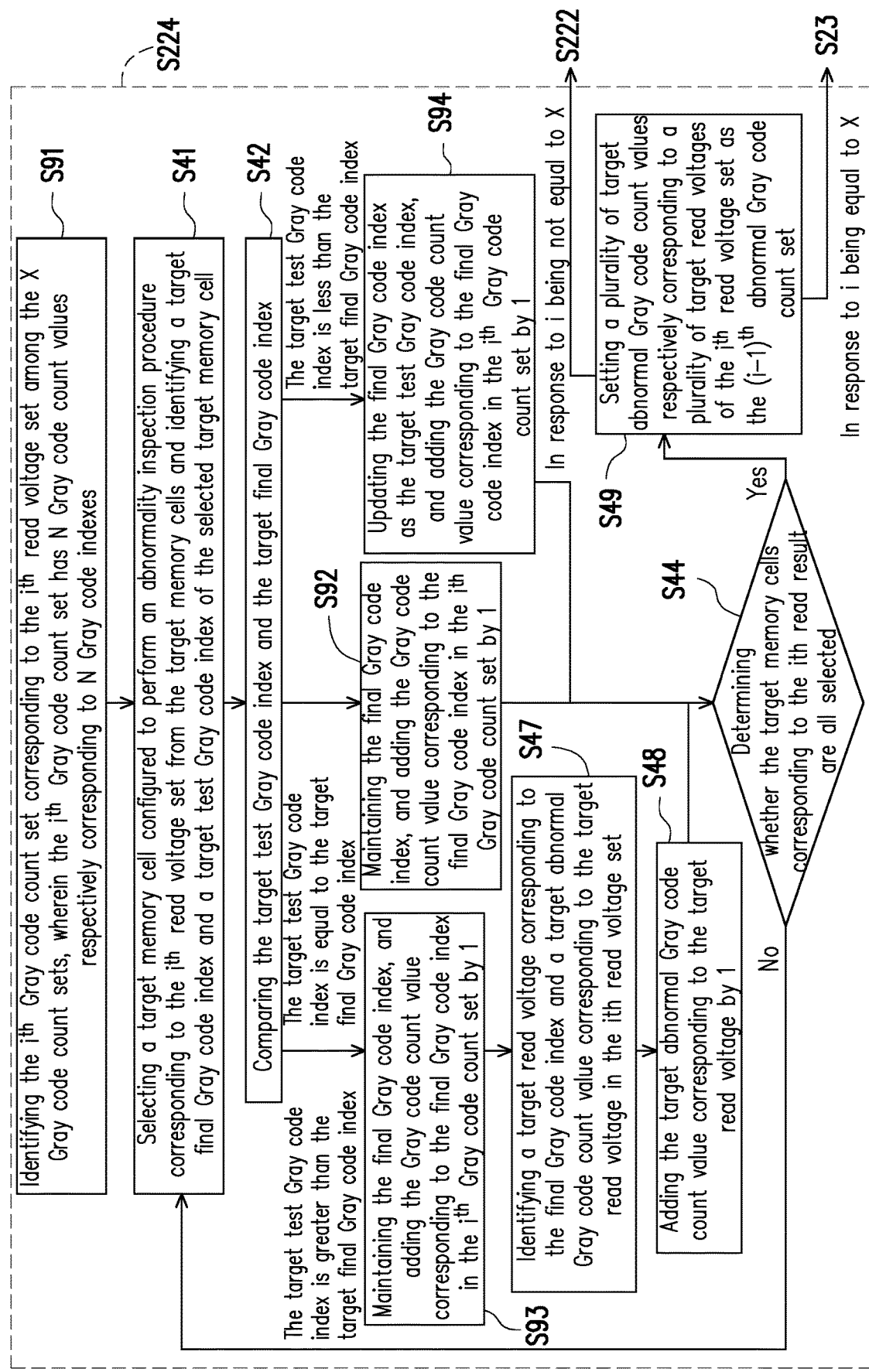
FIG. 9A is a flowchart of step S224 illustrated in FIG. 3 according to another embodiment of the disclosure.

FIG. 9A is a flowchart of step S224 depicted in FIG. 3 according to another embodiment of the disclosure. Referring to FIG. 9A, FIG. 9A illustrates another process flow of step S224 in another embodiment. Namely, in another embodiment, part of the steps included in step S224 are different from those of the step S224 in the original embodiment (for example, referring to FIG. 4). The following only explains the different steps (i.e., steps S91, S92, S93 and S94). Before step S41, the abnormal Gray code counter circuit 2151 performs step S91. Namely, the abnormal Gray code counter circuit 2151 identifies the $i^{th}$ Gray code count set corresponding to the $i^{th}$ read voltage set among the X Gray code count sets. The $i^{th}$ Gray code count set has N Gray code count values respectively corresponding to N Gray code indexes. Specifically, the N Gray code count values of the $i^{th}$ read voltage set are used to accumulate a total amount of the identified target memory cells corresponding to the N Gray code count values after the target word line are read by the $i^{th}$ read voltage set.

Steps S92, S93 and S94 are different from steps S45, S46 and S43 in that the operation of "adding the Gray code count value in the $i^{th}$ Gray code count set corresponding to the target final Gray code index by 1" is added in each of steps S92, S93 and S94. That is to say, besides performing the original operation of each of steps S45, S46 and S43, the abnormal Gray code counter circuit 2151 further performs the operation of accumulating the Gray code count value corresponding to the target final Gray code index when performing steps S92, S93 and S94. Namely, after confirming/updating the target final Gray code index, the abnormal Gray code counter circuit 2151 further accumulates the Gray code count value corresponding to the target final Gray code index.

Figure 9B:
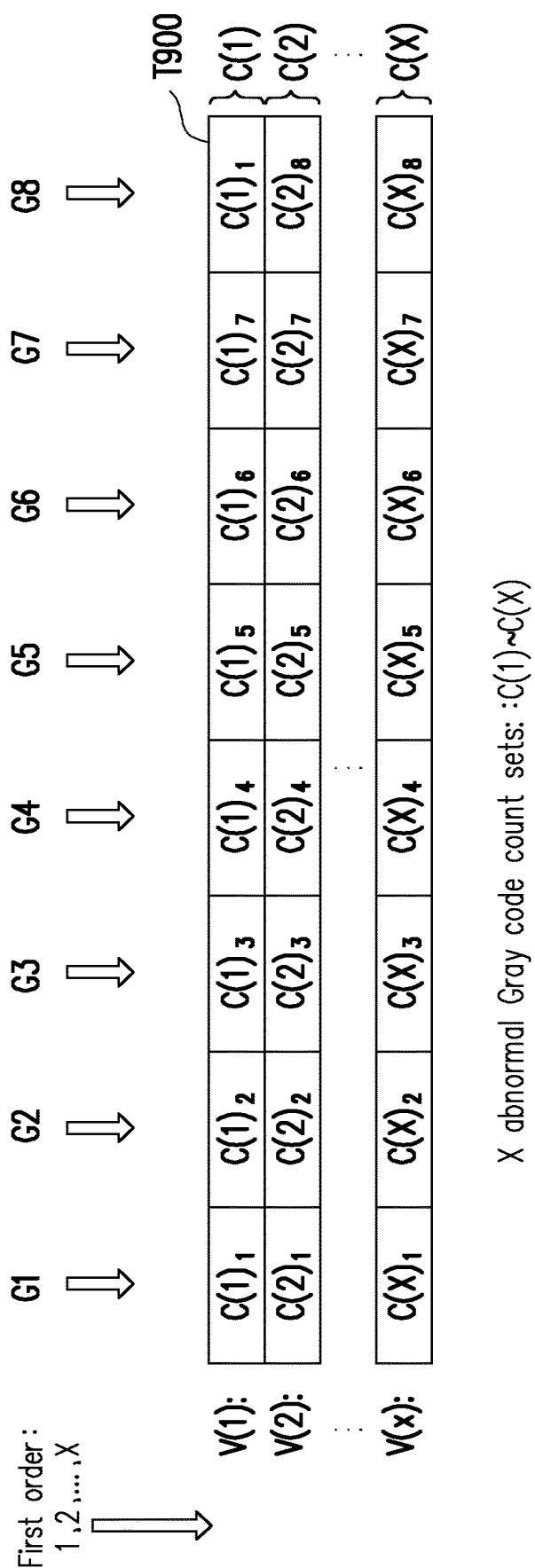
FIG. 9B is a schematic diagram illustrating the Gray code count sets according to another embodiment of the disclosure.

FIG. 9B is a schematic diagram illustrating the Gray code count sets according to another embodiment of the disclosure. For instance, Referring to FIG. 9B, it is assumed that the reading of the target word line by using the read voltage sets V(1) to V(X) is completed. The abnormal Gray code counter circuit 2151 may record X abnormal Gray code count sets C(1) to C(X) in a manner of, for example, the use of Table T900. The N Gray code count values of each of the Gray code count sets correspond to the N Gray code indexes. In comparison with the conventional method for calculating the N Gray code count values corresponding to the N Gray code indexes, in this embodiment, by identifying the abnormal Gray code phenomenon, the final Gray code index may be prevented from being updated by using the incorrect test Gray code index due to the affect from the abnormal Gray code phenomenon, such that the statistics of the Gray code count value corresponding to the final Gray code index may be more accurate.

On the other hand, after the more accurate Gray code count values are obtained, the abnormal Gray code counter circuit 2151 may use the X Gray code count sets C(1) to C(X) to calculate an absolute difference value between each of the Gray code count values and a Gray code count average in each of the Gray code count sets, and the difference value may also be referred to as an absolute deviation-from-average. Then, the abnormal Gray code counter circuit 2151 may calculate a sum of all the absolute deviation-from-averages of each of the Gray code count sets to be a corresponding absolute deviation-from-average sum.

In this way, the read voltage optimization circuit 2152 may use X absolute deviation-from-average sums corresponding to the read voltage sets V(1) to V(X) to identify the optimized read voltage set.

In this embodiment, the Gray code count average may be set according to a total amount of the read memory cells (also referred to as a read memory cells amount). For example, the total amount of the target memory cells is 18592*8 (in this example, the read target memory cells include a plurality of memory cells configured to store the user data of 16 kilobytes (KB) and a plurality of memory cells configured to store the system data of 2208 bytes). The value of "18592" in "18592*8" may be referred to as a Gray code count average (which may be represented by $C_{avg}$) or a Gray code count standard value (which may be represented by $C_{std}$). In other words, the Gray code count standard value is a value of the read memory cells amount divided by N, and the value of N may be set in advance according to physical specifications of the memory, for example, MLC: N=4, TLC: N=8, and QLC: N=16.

It should be noted that in an embodiment, the read voltage management unit 215 (or the abnormal Gray code counter circuit 2151) may calculate the absolute deviation-from-average $ADA(i)_k$ corresponding to each of the Gray code indexes by using the following formula:

$$ADA(i)_k = |C(i)_k - C_{avg}|$$

Therein, i is 1 to X according to a first predetermined order, and k is 1 to N according to a third predetermined order. Namely, a Gray code count deviation value is an absolute value of the difference value between the corresponding Gray code count value and Gray code count average, which will be described with reference to FIG. 9C.

FIG. 9C is a schematic diagram illustrating the determination of the optimized read voltage set according to an embodiment of the disclosure. Referring to FIG. 9C, it is assumed that X is 17, and N is 8. The abnormal Gray code counter circuit 2151 uses 17 read voltage sets V(1) to V(17) to read the target word line, so as to obtain 17 absolute deviation-from-average sets ADA(1) to ADA(17) of the corresponding 17 read voltage sets V(1) to V(17) and a plurality of absolute deviation-from-averages (as illustrated in Table T910, for example). Then, the abnormal Gray code counter circuit 2151 calculates sums of the absolute deviation-from-averages of the absolute deviation-from-average sets ADA(1) to ADA(17) as 17 normal Gray code absolute deviation-from-average sums. For example, the absolute deviation-from-average sum of the abnormal Gray code count set ADA(1) corresponding to the read voltage V(1) is 2726 (i.e., 370+333+345+313+324+399+327+315=2726). Then, the read voltage optimization circuit 2152 may select a minimum one from all the calculated normal Gray code absolute deviation-from-average sums and select the read voltage corresponding to the minimum one as the optimized read voltage set. For example, in the example of Table T910, the normal Gray code absolute deviation-from-average sum corresponding to the read voltage set V(9) is "310", which is the minimum among all the abnormal Gray code count value sums. Accordingly, the read voltage optimization circuit 2152 may directly set the read voltage set V(9) as the optimized read voltage set corresponding to the target word line.

In addition, in yet another embodiment, the read voltage optimization circuit 2152 may use a plurality of second candidate read voltage sets corresponding to a plurality of normal Gray code absolute deviation-from-average sums (as shown in gray background) which are less than an normal Gray code absolute deviation-from-average sum threshold as a plurality of candidates (for example, the read voltage sets V(7) to V(11)) for the optimized read voltage set.

The read voltage optimization circuit 2152 may select one from the second candidate read voltages to serve as the optimized read voltage set of the target word line. Or, alternatively, the read voltage optimization circuit 2152 may, according to a sorting order of the read voltages, search a read voltage corresponding to the minimum abnormal Gray code count value according to the abnormal Gray code count sets corresponding to the second candidate read voltage sets, thereby forming the optimized read voltage set corresponding to the target word line. In an embodiment, the read voltage optimization circuit 2152 may select one having the minimum normal Gray code absolute deviation-from-average sum (as shown in dark gray background) from the second candidate read voltage sets to serve as the optimized read voltage set (i.e. the read voltage set V(9)).

FIG. 9D is a schematic diagram illustrating a search range for determining the optimized read voltage set according to an embodiment of the disclosure. Referring to FIG. 9D, it is assumed that X is 17, and N is 8. Following the example illustrated in FIG. 8, the read voltage optimization circuit 2151 may calculate an average of all the abnormal Gray code count values of each of the abnormal Gray code count sets AC(1) to AC(16) and accordingly, calculate the abnormal Gray code absolute deviation-from-average sum corresponding to each of the abnormal Gray code count sets AC(1) to AC(16). For example, taking the abnormal Gray code count set AC(3) corresponding to the read voltage set V(4) as an example, the abnormal Gray code counter circuit 2151 may calculate that the average of all the abnormal Gray code count averages of the abnormal Gray code count set AC(3) is "4", the corresponding absolute deviation-from-averages are "3, 1, 1, 6, 2, 1 and 2" and 11", and the sum of the absolute deviation-from-averages is "16" (i.e., the abnormal Gray code absolute deviation-from-average sum of the abnormal Gray code count set AC(3)).

By deducing by analogy, as illustrated in Table 920, besides the use of the "abnormal Gray code count value sums" and the "normal Gray code absolute deviation-from-average sums" as described above, the read voltage optimization circuit 2152 may also use the abnormal Gray code absolute deviation-from-average sums corresponding to the abnormal Gray code count sets AC(1) to AC(16) to quickly search a plurality of candidate read voltage sets corresponding to the abnormal Gray code absolute deviation-from-average sums which are less than an abnormal Gray code absolute deviation-from-average sum threshold to use as the candidates for the optimized read voltage set. In this example, it is assumed that the abnormal Gray code absolute deviation-from-average sum threshold is 20. The read voltage optimization circuit 2152 may identify the read voltage sets corresponding to the absolute deviation-from-average sums (as shown in gray background) which are less than the abnormal Gray code absolute deviation-from-average sum threshold as a plurality of third candidate read voltage sets (e.g., the read voltage sets V(4) to V(12)).

The read voltage optimization circuit 2152 may further select one from the third candidate read voltage sets to serve as the optimized read voltage set corresponding to the target word line. Or, alternatively, the read voltage optimization circuit 2152 may, according to a sorting order of the read voltages, search a read voltage corresponding to the minimum abnormal Gray code count value according to the third abnormal Gray code count sets corresponding to the third candidate read voltage sets, thereby forming the optimized read voltage set corresponding to the target word line. In an embodiment, the read voltage management unit may select a third candidate read voltage set having the minimum normal Gray code absolute deviation-from-average sum (as shown in dark gray background) from the third candidate read voltage sets to serve as the optimized read voltage set (i.e. the read voltage set V(6)).

In an embodiment, the read voltage optimization circuit 2152 may use the calculated abnormal Gray code absolute deviation-from-average sums, the normal Gray code absolute deviation-from-average sums and/or the abnormal Gray code count value sums to compare with the corresponding threshold to quickly configure a corresponding search range (as shown in gray background), so as to identify the optimized read voltages used for forming the optimized read voltage set according to the abnormal Gray code count value set corresponding to each of the candidate read voltage sets only for the candidate read voltage sets within the search range.

For example, similar to the description related FIG. 8, after the one or more second candidate read voltage sets are identified according to the normal Gray code absolute deviation-from-average sums and the normal Gray code absolute deviation-from-average sum threshold, the read voltage optimization circuit 2152 may identify a target second candidate read voltage having the minimum abnormal Gray code count value from a $j^{th}$ second candidate read voltage among the (N−1) second candidate read voltages of each of the one or more second candidate read voltage sets and configure the target second candidate read voltage as a $j^{th}$ optimized read voltage among the (N−1) second candidate read voltages of each of the one or more second candidate read voltage sets until the (N−1) optimized read voltages of the optimized read voltage set are all set. For example, according to Table T920, the (N−1) optimized read voltages of the optimized read voltage set are the target second candidate read voltages of $\{V(\mathbf{9})_1, V(\mathbf{7})_2, V(\mathbf{7})_3, V(\mathbf{10})_4, V(\mathbf{7})_5, V(\mathbf{6})_6, V(\mathbf{8})_7\}$ having the abnormal Gray code count values of $\{"0", "1", "0", "1", "0", "0", "0"\}$ (in the second order).

As in another example, after the one or more third candidate read voltage sets are identified according to the abnormal Gray code absolute deviation-from-average sums and the abnormal Gray code absolute deviation-from-average sum threshold, the read voltage optimization circuit 2152 may identify a target third candidate read voltage having the minimum abnormal Gray code count value from a $j^{th}$ third candidate read voltage among the (N−1) third candidate read voltages of each of the one or more third candidate read voltage sets and configure the target third candidate read voltage as a $j^{th}$ optimized read voltage among the (N−1) optimized read voltages of the optimized read voltage set until the (N−1) optimized read voltages of the optimized read voltage set are all set. For example, according to Table T920, the (N−1) optimized read voltages of the optimized read voltage set are the target third candidate read voltages of $\{V(\mathbf{6})_1, V(\mathbf{7})_2, V(\mathbf{7})_3, V(\mathbf{10})_4, V(\mathbf{7})_5, V(\mathbf{6})_6, V(\mathbf{8})_7\}$ having the abnormal Gray code count values of $\{"0", "1", "0", "1", "0", "0", "0"\}$ (in the second order).

It is to be mentioned that in the embodiments described above, the read voltage management unit 215 is implemented in a form of a hardware circuit, but the disclosure is not limited thereto. For example, in an embodiment, the read voltage management unit 215 may be implemented in a software or a hardware form as a read voltage management program code module having the functions of the read voltage management unit 215. The read voltage management program code module may include an abnormal Gray code counter program module and a read voltage optimization program module. The abnormal Gray code counter program module is a program module having the functions of the abnormal Gray code counter circuit 2151. The read voltage optimization program module is a program module having the functions of the read voltage optimization circuit 2152. The processor 211 may access and execute the read voltage management program code module (or the abnormal Gray code counter program module and the read voltage optimization program module) to perform the data reading method (also referred to as the read voltage optimization method) provided by the disclosure.

Based on the above, the data reading method, the storage controller and the storage device provided by the embodiments of the disclosure can update the final Gray code indexes corresponding to all of the target memory cells of the target word line according to the read results obtained by reading the target word line through the read voltage sets, and obtain the corresponding abnormal Gray code count sets, so as to obtain the optimized read voltage set from the read voltage sets according to the abnormal Gray code count sets.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A data reading method for a storage device configured with a rewritable non-volatile memory module, wherein the rewritable non-volatile memory module comprises a plurality of word lines, and each of the word lines is coupled to a plurality of memory cells, the method comprising:
   using X read voltage sets to read a target word line among the plurality of word lines, so as to obtain X read results, wherein a plurality of target memory cells among the plurality of memory cells correspond to the target word line, and all of the plurality of target memory cells are programmed, wherein the X read voltage sets are sorted in a first order according to an average voltage value of each of the X read voltage sets, wherein a difference value of an average voltage value of an $(i+1)^{th}$ read voltage set among the X read voltage sets subtracted by an average voltage value of an $i^{th}$ read voltage set is a positive predetermined voltage offset value, wherein each of the X read voltage sets has (N-1) read voltages sorted according to a second order, wherein X is a first predetermined positive integer, i is a positive integer ranging from 1 to X, i is initially set to 1, and N is a second predetermined positive integer greater than 2;
   in the first order, updating each of final Gray code index of the plurality of target memory cells and obtaining (X-1) abnormal Gray code count sets according to the X read results, wherein an $i^{th}$ read result among the X read results comprises a Gray code corresponding to the $i^{th}$ read voltage set of each of the target memory cells, and the Gray code corresponds to one of N Gray code indexes; and
   selecting (N-1) read voltages from (X-1)*(N-1) read voltages of the corresponding (X-1) read voltage sets according to the obtained (X-1) abnormal Gray code count sets to form an optimized read voltage set.

2. The data reading method as recited in claim 1, wherein according to the first order, updating the final Gray code index of each of the target memory cells and obtaining the (X-1) abnormal Gray code count sets according to the X read results further comprises performing the following sequential steps:
   Step S1, wherein the step S1 comprises: in response to i being equal to 1, identifying an initial Gray code index corresponding to the $i^{th}$ read voltage set of each of the target memory cells according to the $i^{th}$ read result among the X read results and setting the initial Gray code index of each of the target memory cells as the final Gray code index of each of the target memory cells;
   Step S2, wherein the step S2 comprises: adding i by 1;
   Step S3, wherein the step S3 comprises: identifying a test Gray code index corresponding to the $i^{th}$ read voltage set of each of the target memory cells according to the $i^{th}$ read result among the X read results; and
   Step S4, wherein the step S4 comprises: through comparing the test Gray code index corresponding to the $i^{th}$ read voltage set of each of the target memory cells and the final Gray code index, updating the final Gray code index of each of the target memory cells and obtaining an $(i-1)^{th}$ abnormal Gray code count set among the (X-1) abnormal Gray code count sets, wherein the $(i-1)^{th}$ abnormal Gray code count set corresponds to the $i^{th}$ read voltage set,
   wherein in response to i being equal to X in the step S4, the step S4 further comprises: completing the step according to the first order, updating the final Gray code index of each of the target memory cells and obtaining the (X-1) abnormal Gray code count sets according to the X read results, and
   wherein in response to i being not equal to X in the step S4, the step S4 further comprises: performing the step S2, the step S3, and the step S4.

3. The data reading method as recited in claim 2, wherein the step 4 comprises the following sub-steps:
   Step S41, wherein the step S41 comprises: selecting a target memory cell configured to perform an abnormality inspection procedure corresponding to the $i^{th}$ read voltage set from the target memory cells, and identifying a target final Gray code index and a target test Gray code index of the selected target memory cell;
   Step S42, wherein the step S42 comprises: comparing the target test Gray code index and the target final Gray code index;
   Step S43, wherein the step S43 comprises: updating the final Gray code index as the target test Gray code index;
   Step S44, wherein the step S44 comprises: determining whether the plurality of target memory cells corresponding to the read result are all selected;
   Step S45, wherein the step S43 comprises: maintaining the final Gray code index;
   Step S46, wherein the step S46 comprises: maintaining the final Gray code index;
   Step S47, wherein the step S47 comprises: identifying a target read voltage corresponding to the final Gray code index and a target abnormal Gray code count value corresponding to the target read voltage in the i read voltage set;
   Step S48, wherein the step S48 comprises: adding the target abnormal Gray code count value corresponding to the target read voltage by 1; and
   Step S49, wherein the step S49 comprises: setting a plurality of target abnormal Gray code count values respectively corresponding to a plurality of target read voltages of the $i^{th}$ read voltage set as the $(i-1)^{th}$ abnormal Gray code count set, wherein in response to the target test Gray code index being less than the target final Gray code index in the step S42, perform the step S43 and the step S44, wherein in response to the target test Gray code index being equal to the target final Gray code index in the step S42, perform the step S45 and the step S44, wherein in response to the target test Gray code index being greater than the target final Gray code index in the step S42, perform the step S46, the step S47, the step S48, and the step S44, wherein when the plurality of target memory cells corresponding to the ith read result are not all selected in the step 44, perform the step S41 and the step S42, wherein when the plurality of target memory cells corresponding to the ith read result are all selected in the step 44, perform the step S49.

4. The data reading method as recited in claim 1, wherein the step of selecting the (N−1) read voltages from the (X−1)*(N−1) read voltages of the corresponding (X−1) read voltage sets according to the obtained (X−1) abnormal Gray code count sets to form the optimized read voltage set comprises one of the following steps:

Step S5, wherein the step S5 comprises: identifying one or more first candidate read voltage sets among the (X−1) read voltage sets according to an abnormal count value sum threshold and (X−1) abnormal Gray code count value sums corresponding to the (X−1) read voltage sets to configure the optimized read voltage set according to the one or more first candidate read voltage sets;

Step S6, wherein the step S6 comprises: identifying one or more second candidate read voltage sets among the (X−1) read voltage sets according to a normal Gray code absolute deviation-from-average sum threshold and (X−1) normal Gray code absolute deviation-from-average sums corresponding to the (X−1) read voltage sets to configure the optimized read voltage set according to the one or more second candidate read voltage sets; and Step S7, wherein the step S7 comprises: identifying one or more third candidate read voltage sets among the (X−1) read voltage sets according to an abnormal Gray code absolute deviation-from-average sum threshold and (X−1) abnormal Gray code absolute deviation-from-average sums corresponding to the (X−1) read voltage sets to configure the optimized read voltage set according to the one or more third candidate read voltage sets.

5. The data reading method as recited in claim 4, wherein the step S5 comprises:

calculating the (X−1) abnormal Gray code count value sums corresponding to the (X−1) abnormal Gray code count sets, wherein a first abnormal Gray count value sum of a first abnormal Gray code count set among the (X−1) abnormal Gray code count sets is a sum of all the abnormal Gray count values of the first abnormal Gray code count set; and identifying one or more target abnormal Gray code count value sums which are less than the abnormal count value sum threshold from the (X−) abnormal Gray code count value sums and identifying the one or more first candidate read voltage sets corresponding to the one or more target abnormal Gray code count value sums from the (X−1) read voltage sets, wherein the step S6 comprises:

calculating the (X−1) normal Gray code absolute deviation-from-average sums corresponding to the (X−1) read voltage sets according to (X−1) Gray code count sets corresponding to the (X−1) read voltage sets and a Gray code count average; and identifying one or more normal Gray code absolute deviation-from-average sums which are less than the normal Gray code absolute deviation-from-average sum threshold from the (X−1) normal Gray code absolute deviation-from-average sums and identifying the one or more second candidate read voltage sets corresponding to the one or more target Gray code absolute deviation-from-average sums from the (X−1) read voltage sets, wherein the step S7 comprises:

calculating (X−1) abnormal Gray code count averages corresponding to the (X−1) abnormal Gray code count sets, wherein a first abnormal Gray count average of the first abnormal Gray code count set among the (X−1) abnormal Gray code count sets is an average of all the abnormal Gray count values of the first abnormal Gray code count set;

calculating the (X−1) abnormal Gray code absolute deviation-from-average sums corresponding to the (X−1) abnormal Gray code count sets according to the (X−1) abnormal Gray code count sets and the (X−1) abnormal Gray code count averages corresponding to the (X−1) abnormal Gray code count sets; and identifying one or more target abnormal Gray code absolute deviation-from-average sums which are less than the abnormal Gray code absolute deviation-from-average sum threshold from the (X−1) abnormal Gray code absolute deviation-from-average sums and identifying the one or more third candidate read voltage sets corresponding to the one or more target abnormal Gray code absolute deviation-from-average sums from the (X−) read voltage sets.

6. The data reading method as recited in claim 5, wherein the step S5 further comprises:

setting a first candidate read voltage set having a minimum abnormal Gray code count value sum among the one or more first candidate read voltage sets as the optimized read voltage set, wherein the step S6 further comprises:

setting a second candidate read voltage set having a minimum normal Gray code absolute deviation-from-average sum among the one or more second candidate read voltage sets as the optimized read voltage set, wherein the step S7 further comprises:

setting a third candidate read voltage set having a minimum abnormal Gray code absolute deviation-from-average sum among the one or more third candidate read voltage sets as the optimized read voltage set.

7. The data reading method as recited in claim 5, wherein the step S5 further comprises:

identifying a target first candidate read voltage having a minimum abnormal Gray code count value from a $j^{th}$ first read voltage among (N−1) first candidate read voltages of each of the one or more first candidate read voltage sets and setting the target first candidate read voltage as a $j^{th}$ read voltage among the (N−1)

read voltages of the optimized read voltage set until all of the (N−1) read voltages of the optimized read voltage set are set, wherein the step S6 further comprises:

identifying a target second candidate read voltage having a minimum abnormal Gray code count value from a $j^{th}$ second candidate read voltage among (N−1) second candidate read voltages of each of the one or more second candidate read voltage sets and setting the target second candidate read voltage as a $j^{th}$ read voltage among the (N−1) read voltages of the optimized read voltage set until all of the (N−1) read voltages of the optimized read voltage set are set, wherein the step S7 further comprises:

identifying a target third candidate read voltage having a minimum abnormal Gray code count value from a $j^{th}$ third candidate read voltage among (N−1) third candidate read voltages of each of the one or more third candidate read voltage sets and setting the target third candidate read voltage as a $j^{th}$ read voltage among the (N−1) read voltages of the optimized read voltage set until all of the (N−1) read voltages of the optimized read voltage set are set.

8. A storage controller configured for controlling a storage device disposed with a rewritable non-volatile memory module, comprising:

a memory interface control circuit, configured to couple to the rewritable non-volatile memory module, wherein the rewritable non-volatile memory module comprises a plurality of word lines, and each of the plurality of word lines is coupled to a plurality of memory cells;

a read voltage management unit; and a processor, coupled to the memory interface control circuit and the read voltage management unit, wherein the processor selects a target word line from the plurality of word lines and instructs the read voltage management unit to perform a read voltage optimization operation corresponding to the target word line, wherein in the read voltage optimization operation, the read voltage management unit is configured to use X read voltage sets to read the target word line among the plurality of word lines, so as to obtain X read results, wherein a plurality of target memory cells among the plurality of memory cells correspond to the target word line, and all of the plurality of target memory cells are programmed, wherein the X read voltage sets are sorted in a first order according to an average voltage value of each of the X read voltage sets, wherein a difference value of an average voltage value of an $(i+1)^{th}$ read voltage set among the X read voltage sets subtracted by an average voltage value of an $i^{th}$ read voltage set is a positive predetermined voltage offset value, wherein each of the X read voltage sets has (N−1) read voltages sorted in a second order, wherein X is a first predetermined positive integer, i is a positive integer ranging from 1 to X, i is initially set to 1, and N is a second predetermined positive integer greater than 2;

wherein the read voltage management unit is further configured according to the first order, update a final Gray code index of each of the plurality of target memory cells and obtain (X−1) abnormal Gray code count sets according to the X read results, wherein an $i^{th}$ read result among the X read results comprises a Gray code corresponding to the $i^{th}$ read voltage set of each of the plurality of target memory cells, and the Gray code corresponds to one of N Gray code indexes, wherein the read voltage management unit is further configured to select (N−1) read voltages from (X−1)*(N−1) read voltages of the corresponding (X−1) read voltage sets according to the obtained (X−1) abnormal Gray code count sets to form an optimized read voltage set.

9. The storage controller as recited in claim 8, wherein the operation that the read voltage management unit is further configured to in the first order, update the final Gray code index of each of the plurality of target memory cells and obtain the (X−1) abnormal Gray code count sets according to the X read results further comprises the following sequential operations:

Operation S1, wherein the operation S1 comprises: in response to i being equal to 1, the read voltage management unit identifying an initial Gray code index corresponding to the $i^{th}$ read voltage set of each of the plurality of target memory cells according to the read result among the X read results and setting the initial Gray code index of each of the target memory cells as the final Gray code index of each of the plurality of target memory cells;

Operation S2, wherein the operation S2 comprises: the read voltage management unit adding i by 1;

Operation S3, wherein the operation S3 comprises: the read voltage management unit identifying a test Gray code index corresponding to the $i^{th}$ read voltage set of each of the plurality of target memory cells according to the $i^{th}$ read result among the X read results; and Operation S4, wherein the operation S4 comprises: through comparing the test Gray code index corresponding to the $i^{th}$ read voltage set of each of the plurality of target memory cells and the final Gray code index, the read voltage management unit updating the final Gray code index of each of the plurality of target memory cells and obtain an $(i-1)^{th}$ abnormal Gray code count set among the (X−1) abnormal Gray code count sets, wherein the $(i-1)^{th}$ abnormal Gray code count set corresponds to the $i^{th}$ read voltage set, wherein in response to i being equal to 1 in the operation S4, the read voltage management unit is further configured to complete the operation in the first order, update the final Gray code index of each of the plurality of target memory cells and obtain the (X−1) abnormal Gray code count sets according to the X read results, and wherein in response to i being not equal to 1 in the operation S4, the read voltage management unit is further configured to perform the operation S2, the operation S3, and the operation S4.

10. The storage controller as recited in claim 9, wherein the operation S4 comprises the following sub-operations:

Operation S41, wherein the operation S41 comprises: the read voltage management unit selecting a target memory cell configured to perform an abnormality inspection procedure corresponding to the $i^{th}$ read voltage set from the plurality of target memory cells and identifying a target final Gray code index and a target test Gray code index of the selected target memory cell;

Operation S42, wherein the operation S42 comprises: the read voltage management unit comparing the target test Gray code index and the target final Gray code index;

Operation S43, wherein the operation S43 comprises: the read voltage management unit updating the final Gray code index as the target test Gray code index;

Operation S44, wherein the operation S44 comprises: the read voltage management unit determining whether the target memory cells corresponding to the read result are all selected;

Operation S45, wherein the operation S45 comprises: the read voltage management unit maintaining the final Gray code index;

Operation S46, wherein the operation S46 comprises: the read voltage management unit maintaining the final Gray code index;

Operation S47, wherein the operation S47 comprises: the read voltage management unit identifying a target read voltage corresponding to the final Gray code index and a target abnormal Gray code count value corresponding to the target read voltage in the $i^{th}$ read voltage set;

Operation S48, wherein the operation S48 comprises: the read voltage management unit adding the target abnormal Gray code count value corresponding to the target read voltage by 1; and Operation S49, wherein the operation S49 comprises: the read voltage management unit setting a plurality of target abnormal Gray code count values respectively corresponding to a plurality of target read voltages of the $i^{th}$ read voltage set to the $(i-1)^{th}$ abnormal Gray code count set, wherein in response to the target test Gray code index being less than the target final Gray code index in the operation S42, the read voltage management unit is configured to perform the operation S43 and the operation S44, wherein in response to the target test Gray code index being equal to the target final Gray code index in the operation S42, the read voltage management unit is configured to perform the operation S45 and the operation S44, wherein in response to the target test Gray code index being greater than the target final Gray code index in the operation S42, the read voltage management unit is configured to perform the operation S46, the operation S47, the operation S48, and the operation S44, wherein when the plurality of target memory cells corresponding to the ith read result are not all selected in the operation S44, the read voltage management unit is configured to perform the operation S42, wherein when the target memory cells corresponding to the ith read result are all selected in the operation S44, the read voltage management unit is configured to perform the operation S49.

11. The storage controller as recited in claim 8, wherein in the operation of the read voltage management unit selecting the (N−1) read voltages from the (X−1)*(N−1) read voltages of the corresponding (X−1) read voltage sets according to the obtained (X−1) abnormal Gray code count sets to form the optimized read voltage set, the read voltage management unit is configured to perform one of the following operations:

Operation S5, wherein the operation S5 comprises: identifying one or more first candidate read voltage sets among the (X−1) read voltage sets according to an abnormal count value sum threshold and (X−1) abnormal Gray code count value sums corresponding to the (X−1) read voltage sets to set the optimized read voltage set according to the one or more first candidate read voltage sets;

Operation S6, wherein the operation S6 comprises: identifying one or more second candidate read voltage sets among the (X−1) read voltage sets according to a normal Gray code absolute deviation-from-average sum threshold and (X−1) normal Gray code absolute deviation-from-average sums corresponding to the (X−1) read voltage sets to set the optimized read voltage set according to the one or more second candidate read voltage sets; and Operation S7, wherein the operation S7 comprises: identifying one or more third candidate read voltage sets among the (X−1) read voltage sets according to an abnormal Gray code absolute deviation-from-average sum threshold and (X−1) abnormal Gray code absolute deviation-from-average sums corresponding to the (X−1) read voltage sets to set the optimized read voltage set according to the one or more third candidate read voltage sets.

12. The storage controller as recited in claim 11, wherein in the operation S5, the read voltage management unit calculates the (X−1) abnormal Gray code count value sums corresponding to the (X−1) abnormal Gray code count sets, wherein a first abnormal Gray count value sum of a first abnormal Gray code count set among the (X−1) abnormal Gray code count sets is a sum of all the abnormal Gray count values of the first abnormal Gray code count set, wherein the read voltage management unit identifies one or more target abnormal Gray code count value sums which are less than the abnormal count value sum threshold from the (X−1) abnormal Gray code count value sums and identifying the one or more first candidate read voltage sets corresponding to the one or more target abnormal Gray code count value sums from the (X−1) read voltage sets, wherein in the operation S6, the read voltage management unit calculates the (X−1) normal Gray code absolute deviation-from-average sums corresponding to the (X−1) read voltage sets according to (X−1) Gray code count sets corresponding to the (X−1) read voltage sets and a Gray code count average, wherein the read voltage management unit identifies one or more normal Gray code absolute deviation-from-average sums which are less than the normal Gray code absolute deviation-from-average sum threshold from the (X−1) normal Gray code absolute deviation-from-average sums and identifies the one or more second candidate read voltage sets corresponding to the one or more target Gray code absolute deviation-from-average sums from the (X−1) read voltage sets, wherein in the operation S7, the read voltage management unit calculates (X−1) abnormal Gray code count averages corresponding to the (X−1) abnormal Gray code count sets, wherein a first abnormal Gray count average of the first abnormal Gray code count set among the (X−1) abnormal Gray code count sets is an average of all the abnormal Gray count values of the first abnormal Gray code count set;

wherein the read voltage management unit calculates the (X−1) abnormal Gray code absolute deviation-from-average sums corresponding to the (X−1) abnormal Gray code count sets according to the (X−1) abnormal Gray code count sets and the (X−1) abnormal Gray code count averages corresponding to the (X−1) abnormal Gray code count sets, wherein the read voltage management unit identifies one or more target abnormal Gray code absolute deviation-from-average sums which are less than the abnormal Gray code absolute deviation-from-average sum threshold from the (X−1) abnormal Gray code absolute deviation-from-average sums and identifies the one or more third candidate read voltage sets corresponding to the one or more target abnormal Gray code absolute deviation-from-average sums from the (X−1) read voltage sets.

13. The storage controller as recited in claim 12,
wherein in the operation S5,
the read voltage management unit configures a first candidate read voltage set having a minimum abnormal Gray code count value sum among the one or more first candidate read voltage sets as the optimized read voltage set,
wherein in the operation S6,
the read voltage management unit configures a second candidate read voltage set having a minimum normal Gray code absolute deviation-from-average sum among the one or more second candidate read voltage sets as the optimized read voltage set,
wherein in the operation S7,
the read voltage management unit configures a third candidate read voltage set having a minimum abnormal Gray code absolute deviation-from-average sum among the one or more third candidate read voltage sets as the optimized read voltage set.

14. The storage controller as recited in claim 12,
wherein in the operation S5,
the read voltage management unit identifies a target first candidate read voltage having a minimum abnormal Gray code count value from a $j^{th}$ first read voltage among (N−1) first candidate read voltages of each of the one or more first candidate read voltage sets and configures the target first candidate read voltage as a $j^{th}$ read voltage among the (N−1) read voltages of the optimized read voltage set until all of the (N−1) read voltages of the optimized read voltage set are configured,
wherein in the operation S6,
the read voltage management unit identifies a target second candidate read voltage having a minimum abnormal Gray code count value from a $j^{th}$ second candidate read voltage among (N−1) second candidate read voltages of each of the one or more second candidate read voltage sets and configures the target second candidate read voltage as a $j^{th}$ read voltage among the (N−1) read voltages of the optimized read voltage set until all of the (N−1) read voltages of the optimized read voltage set are configured,
wherein in the operation S7,
the read voltage management unit identifies a target third candidate read voltage having a minimum abnormal Gray code count value from a $j^{th}$ third candidate read voltage among (N−1) third candidate read voltages of each of the one or more third candidate read voltage sets and configures the target third candidate read voltage as a $j^{th}$ read voltage among the (N−1) read voltages of the optimized read voltage set until all of the (N−1) read voltages of the optimized read voltage set are set.

15. A storage device, comprising:
a rewritable non-volatile memory module, wherein the rewritable non-volatile memory module comprises a plurality of word lines, and each of the plurality of word lines is coupled to a plurality of memory cells;
a memory interface control circuit, configured to couple to the rewritable non-volatile memory module, and
a processor, coupled to the memory interface control circuit, wherein the processor loads and executes a read voltage management program code module to perform a read voltage optimization operation, wherein the read voltage optimization operation comprises the following steps:
using X read voltage sets to read a target word line among the plurality of word lines, so as to obtain X read results, wherein a plurality of target memory cells among the plurality of memory cells correspond to the target word line, and all of the target plurality of memory cells are programmed, wherein the X read voltage sets are sorted in a first order according to an average voltage value of each of the X read voltage sets, wherein a difference value of an average voltage value of an $(i+1)^{th}$ read voltage set among the X read voltage sets subtracted by an average voltage value of an $i^{th}$ read voltage set is a positive predetermined voltage offset value, wherein each of the X read voltage sets has (N−1) read voltages are arranged according to a second order, wherein X is a first predetermined positive integer, i is a positive integer ranging from 1 to X, i is initially set to 1, and N is a second predetermined positive integer greater than 2;
in the first order, updating a final Gray code index of each of the plurality of target memory cells and obtaining (X−1) abnormal Gray code count sets according to the X read results, wherein an $i^{th}$ read result among the X read results comprises a Gray code corresponding to the $i^{th}$ read voltage set of each of the plurality of target memory cells, and the Gray code corresponds to one of N Gray code indexes; and
selecting (N−1) read voltages from (X−1)*(N−1) read voltages of the corresponding (X−1) read voltage sets according to the obtained (X−1) abnormal Gray code count sets to form an optimized read voltage set.

* * * * *